(12) United States Patent
Schieffer, Jr. et al.

(10) Patent No.: US 9,069,252 B2
(45) Date of Patent: *Jun. 30, 2015

(54) METHOD FOR PREPARING A RELIEF PRINTING FORM

(75) Inventors: Edmund Francis Schieffer, Jr., Wilmington, DE (US); Marcia Jungran Cho, Newark, DE (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/593,092

(22) Filed: Aug. 23, 2012

(65) Prior Publication Data

US 2013/0216955 A1 Aug. 22, 2013

Related U.S. Application Data

(60) Provisional application No. 61/527,725, filed on Aug. 26, 2011.

(51) Int. Cl.
| G03F 7/26 | (2006.01) |
| G03F 7/20 | (2006.01) |
| G03F 7/36 | (2006.01) |

(52) U.S. Cl.
CPC ............. *G03F 7/2041* (2013.01); *G03F 7/202* (2013.01); *G03F 7/36* (2013.01)

(58) Field of Classification Search
CPC ....... G03F 7/004; G03F 7/202; G03F 7/2041; G03F 7/36; G03F 7/20; G03F 7/2014; B41M 2205/00; B41M 9/00; B41N 1/00

USPC .......................................................... 430/306
See application file for complete search history.

(56) References Cited

U.S. PATENT DOCUMENTS

| 2,760,863 A | 8/1956 | Plambeck, Jr. |
| 2,927,024 A | 3/1960 | Woodward et al. |
| 3,036,913 A | 5/1962 | Burg |
| 3,060,023 A | 11/1962 | Burg et al. |
| 3,144,331 A | 8/1964 | Thommes |
| 3,264,103 A | 8/1966 | Cohen et al. |
| 3,796,602 A | 3/1974 | Briney et al. |

(Continued)

FOREIGN PATENT DOCUMENTS

| DE | 3828551 A1 | 8/1990 |
| EP | 0 017 927 A2 | 4/1980 |

(Continued)

OTHER PUBLICATIONS

U.S. Appl. No. 12/791,382, filed Jun. 1, 2010, Rudolph.

(Continued)

*Primary Examiner* — Chanceity Robinson

(57) ABSTRACT

The invention provides a method for preparing a relief printing form from a photosensitive element. The method includes forming an in-situ mask disposed above a photopolymerizable layer of the photosensitive element, exposing the element to actinic radiation through the in-situ mask in an environment having an inert gas and a concentration of oxygen between about 50,000 ppm and about 2000 ppm to form at least a polymerized portion and an unpolymerized portion of the layer, and treating by heating the exposed element to a temperature sufficient to cause the unpolymerized portion to melt, soften, or flow.

14 Claims, 44 Drawing Sheets

(56) References Cited

U.S. PATENT DOCUMENTS

| | | |
|---|---|---|
| 4,045,231 A | 8/1977 | Toda et al. |
| 4,177,074 A | 12/1979 | Proskow |
| 4,323,636 A | 4/1982 | Chen |
| 4,323,637 A | 4/1982 | Chen et al. |
| 4,427,759 A | 1/1984 | Gruetzmacher |
| 4,430,417 A | 2/1984 | Heinz et al. |
| 4,431,723 A | 2/1984 | Proskow |
| 4,460,675 A | 7/1984 | Gruetzmacher et al. |
| 4,517,279 A | 5/1985 | Worns |
| 4,540,649 A | 9/1985 | Sakurai |
| 4,726,877 A | 2/1988 | Fryd et al. |
| 4,753,865 A | 6/1988 | Fryd et al. |
| 4,806,506 A | 2/1989 | Gibson, Jr. |
| 4,894,315 A | 1/1990 | Feinberg et al. |
| 4,942,111 A | 7/1990 | Wade et al. |
| 4,956,252 A | 9/1990 | Fryd et al. |
| 5,015,556 A | 5/1991 | Martens |
| 5,175,072 A | 12/1992 | Martens |
| 5,215,859 A | 6/1993 | Martens |
| 5,262,275 A | 11/1993 | Fan |
| 5,279,697 A | 1/1994 | Peterson et al. |
| 5,301,610 A | 4/1994 | McConnell |
| 5,330,882 A | 7/1994 | Kawaguchi et al. |
| 5,385,611 A | 1/1995 | Matsumoto et al. |
| 5,486,384 A | 1/1996 | Bastian et al. |
| 5,506,086 A | 4/1996 | Van Zoeren |
| 5,516,626 A | 5/1996 | Ohmi et al. |
| 5,562,039 A | 10/1996 | Fox et al. |
| 5,607,814 A | 3/1997 | Fan et al. |
| 5,645,974 A | 7/1997 | Ohta et al. |
| 5,654,125 A | 8/1997 | Fan et al. |
| 5,679,485 A | 10/1997 | Suzuki et al. |
| 5,688,633 A | 11/1997 | Leach |
| 5,705,310 A | 1/1998 | Van Zoeren |
| 5,707,773 A | 1/1998 | Grossman et al. |
| 5,719,009 A | 2/1998 | Fan |
| 5,760,880 A | 6/1998 | Fan et al. |
| 5,766,819 A | 6/1998 | Blanchet-Fincher |
| 5,771,809 A | 6/1998 | Hecht |
| 5,798,019 A | 8/1998 | Cushner et al. |
| 5,830,621 A | 11/1998 | Suzuki et al. |
| 5,840,463 A | 11/1998 | Blanchet-Fincher |
| 5,863,704 A | 1/1999 | Sakurai et al. |
| 5,888,701 A | 3/1999 | Fan |
| 6,037,102 A | 3/2000 | Loerzer et al. |
| 6,185,840 B1 | 2/2001 | Noelle et al. |
| 6,217,965 B1 | 4/2001 | Gelbart |
| 6,238,837 B1 | 5/2001 | Fan |
| 6,284,431 B1 | 9/2001 | Tanizaki et al. |
| 6,492,095 B2 * | 12/2002 | Samworth .................... 430/306 |
| 6,558,876 B1 | 5/2003 | Fan |
| 6,673,509 B1 | 1/2004 | Metzger |
| 6,766,740 B1 | 7/2004 | Wier |
| 6,773,859 B2 | 8/2004 | Fan et al. |
| 6,797,454 B1 | 9/2004 | Johnson et al. |
| 6,929,898 B2 | 8/2005 | Fan |
| 7,105,206 B1 | 9/2006 | Beck et al. |
| 7,348,123 B2 | 3/2008 | Mengel et al. |
| 7,399,575 B2 | 7/2008 | Takagi et al. |
| 8,236,479 B2 | 8/2012 | Rudolph |
| 2002/0115019 A1 | 8/2002 | Kaczun et al. |
| 2003/0211419 A1 | 11/2003 | Fan |
| 2004/0048199 A1 | 3/2004 | Schadebrodt et al. |
| 2004/0234886 A1 | 11/2004 | Rudolph et al. |
| 2004/0259033 A1 | 12/2004 | Kunita |
| 2005/0142480 A1 | 6/2005 | Bode et al. |
| 2005/0231708 A1 | 10/2005 | Sunagawa et al. |
| 2005/0266358 A1 | 12/2005 | Roberts et al. |
| 2006/0016355 A1 | 1/2006 | Saai et al. |
| 2006/0055761 A1 | 3/2006 | Daems et al. |
| 2006/0105268 A1 | 5/2006 | Vest |
| 2006/0144272 A1 | 7/2006 | Haraguchi et al. |
| 2008/0063979 A1 | 3/2008 | Tomita et al. |
| 2009/0186308 A1 | 7/2009 | Rudolph |
| 2009/0191482 A1 | 7/2009 | Rudolph et al. |
| 2009/0191483 A1 * | 7/2009 | Rudolph et al. .............. 430/306 |
| 2009/0245613 A1 | 10/2009 | Wu et al. |
| 2010/0143841 A1 | 6/2010 | Stolt et al. |
| 2010/0218694 A1 | 9/2010 | Wier et al. |
| 2011/0039211 A1 * | 2/2011 | Hannum et al. .............. 430/306 |
| 2012/0060711 A1 | 3/2012 | Rudolph |

FOREIGN PATENT DOCUMENTS

| | | |
|---|---|---|
| EP | 0 741 330 A1 | 11/1996 |
| EP | 0 891 877 A2 | 1/1999 |
| EP | 0 945 753 A1 | 9/1999 |
| EP | 1 160 627 A2 | 12/2001 |
| EP | 1 457 823 A2 | 1/2009 |
| EP | 2 083 325 A2 | 1/2009 |
| EP | 2 085 820 A2 | 8/2009 |
| JP | 53-008655 A | 1/1978 |
| JP | 58-063939 | 4/1983 |
| JP | 03-239263 | 10/1991 |
| JP | 06-214377 | 8/1994 |
| JP | 2002/357907 | 12/2002 |
| JP | 2004/302447 | 10/2004 |
| JP | 2005/266467 | 9/2005 |
| JP | 2005/283778 A | 10/2005 |
| JP | 2005-316325 | 11/2005 |
| JP | 2006/130777 | 5/2006 |
| JP | 2007/086781 | 5/2007 |
| JP | 2007/519021 | 7/2007 |
| JP | 2009-058902 | 3/2009 |
| NL | 8 900 784 A | 3/1989 |
| WO | 92/21518 A1 | 12/1992 |
| WO | 2005/026836 A2 | 3/2005 |
| WO | 2008/034810 A2 | 3/2008 |
| WO | 2009/020496 A1 | 2/2009 |
| WO | 2009/033124 A2 | 3/2009 |
| WO | WO 2009033124 A2 * | 3/2009 |
| WO | 2009/016974 A1 | 5/2009 |
| WO | 2011/002967 A1 | 1/2011 |

OTHER PUBLICATIONS

U.S. Appl. No. 13/320,831, filed Jul. 1, 2010, Rudolph.
U.S. Appl. No. 13/349,608, filed Sep. 1, 2007, Rudolph.
U.S. Appl. No. 13/527,771, filed Jun. 20, 2012, Rudolph.
U.S. Appl. No. 12/356,752, filed Aug. 3, 2011, Rudolph et al.
U.S. Appl. No. 13/493,004, filed Jun. 11, 2012, Rudolph et al.
U.S. Appl. No. 13/527,936, filed Jun. 20, 2012, Rudolph et al.
U.S. Appl. No. 12/401,106, filed Mar. 10, 2009, Rudolph et al.
U.S. Appl. No. 61/692,457, filed Aug. 12, 2012, Schieffer et al.
U.S. Appl. No. 13/771,310, filed Feb. 20, 2013, Schieffer, Jr. et al.
IM1377 PCT Search Report.
IM1359 EP Search Report.
IM1341 PCT Search Report.
IM1346 EP Search Report.
B. Taylor, R. Fan, G. Blanchet, "The Digital Difference", FLEXO™ Magazine, Jul. 1997.
Flexography: Principles and Practice, Ronkonkoma, New York—4$^{th}$ Edition and 5$^{th}$ Edition, 1999 (Book Not Included).
Flexography: Principles and Practice, Ronkonkoma, New York—4th Edition and 5th Edition, 1999, Chapters 8-12, pp. 103-379, (Chapter 8, pp. 103-147; Chapter 9, pp. 149-177; Chapter 10, pp. 181-288; Chapter 11, pp. 289-318; Chapter 12, pp. 319-376.
Charles R. Morgan and David R. Kyle. UV Generated Oxygen Scavengers and Method for Determining Their Effectiveness in Photopolymerizable Systems, Journal of Radiation Curing, Oct. 1983, pp. 4-7.
Dr. A.R. Kannurpatti and Dr. B.K. Taylor, Taming Photopolymerization, The Platemaker's Role in Controlling the Process, Product Trend Report, Flexographic Technical Association, FLEXO, Nov. 2001.
Takashi Odajima, Honggi Bae, Tadashi Kawamoto, Yuichi Nakajima, and Yoshikazu Matsumoto, Abstract of WO 2009/016974 A1, Nakan Corporation, Feb. 5, 2009.
(PCT/US2012/052075, Filed Aug. 23, 2012) International Preliminary Report on Patentability/Written Opinion of the International Search Authority.

* cited by examiner

Cleanout Depth Along Measurement Vector: 28μm

Cleanout Depth Along Measurement Vector: 60μm

METHOD FOR PREPARING A RELIEF PRINTING FORM

CROSS-REFERENCE TO RELATED APPLICATIONS

This application claims priority under 35 U.S.C. §119 from U.S. Provisional Application Ser. No. 61/527,725 (filed Aug. 26, 2011), the disclosure of which is incorporated by reference herein for all purposes as if fully set forth.

BACKGROUND OF THE INVENTION

1. Field of the Disclosure

This invention pertains to a method for preparing a relief printing form from a photosensitive element, and in particular, to a method of preparing the relief printing form by imagewise exposing the photosensitive element in a specific environment, and then thermally treating.

2. Description of Related Art

Flexographic printing plates are widely used for printing of packaging materials ranging from corrugated carton boxes to cardboard boxes and to continuous web of plastic films. Flexographic printing plates are used in relief printing in which ink is carried from a raised-image surface and transferred to a substrate. Flexographic printing plates can be prepared from photopolymerizable compositions, such as those described in U.S. Pat. Nos. 4,323,637 and 4,427,759. Photosensitive elements generally have a solid layer of the photopolymerizable composition interposed between a support and a coversheet or a multilayer cover element. Flexographic printing plates are characterized by their ability to crosslink or cure upon exposure to actinic radiation. The plate is imagewise exposed with actinic radiation through an image-bearing art-work or a template, such as a photographic negative or transparency (e.g., silver halide films) for so called analog workflow, or through an in-situ mask having radiation opaque areas that had been previously formed above the photopolymerizable layer for so called digital workflow. The actinic radiation exposure is typically conducted with ultraviolet (UV) radiation. The actinic radiation enters the photosensitive element through the clear areas and is blocked from entering the black or opaque areas of the transparency or in-situ mask. The areas of the photopolymerizable layer that were exposed to the actinic radiation crosslink and harden and/or become insoluble to solvents used during development. The unexposed areas of the photopolymerizable layer that were under the opaque regions of the transparency or the in-situ mask during exposure do not hardened and/or remain soluble. The unexposed areas are removed by treating with a washout solution or heat leaving a relief image suitable for printing. If treated with washout solution, the plate is dried. After all desired processing steps, the plate is then mounted on a cylinder and used for printing.

An alternative to solution development, the thermal development process is desired as the process removes the unexposed areas while avoiding the subsequent time-consuming drying step associated with solution development. In a thermal development process, the photosensitive layer, which has been imagewise exposed to actinic radiation, is contacted with an absorbent material at a temperature sufficient to cause the composition in the unexposed portions of the photosensitive layer to soften or melt and flow into an absorbent material. See U.S. Pat. No. 3,060,023 (Burg et al.); U.S. Pat. No. 3,264,103 (Cohen et al.); U.S. Pat. No. 5,015,556 (Martens); U.S. Pat. No. 5,175,072 (Martens); U.S. Pat. No. 5,215,859 (Martens); and U.S. Pat. No. 5,279,697 (Peterson at al.). The exposed portions of the photosensitive layer remain hard, that is do not soften or melt, at the softening temperature for the unexposed portions. The absorbent material collects the softened un-irradiated material and then is separated from the photosensitive layer. The cycle of heating and contacting the photosensitive layer with the absorbent material may need to be repeated several times in order to sufficiently remove the flowable composition from the un-irradiated areas and form a relief structure suitable for printing. After such processing, there remains a raised relief structure of irradiated, hardened composition that represents the irradiated image.

However with increasing demands on quality, the current state-of-the-art flexographic printing forms may not perform as desired and have trouble meeting the ever increasing demands on quality.

Solid plate preparation workflows involve making an intermediate, i.e., the photographic negative or phototool. Analog workflow requires the preparation of the phototool, which is a complicated, costly and time-consuming process requiring separate processing equipment and chemical development solutions. In addition, the phototool may change slightly in dimension due to changes in temperature and humidity. The same phototool, when used at different times or in different environments, may give different results. Use of a phototool also requires special care and handling when fabricating flexographic printing forms to ensure intimate contact is maintained between the phototool and plate. In particular, care is required in the placement of both the phototool and the plate in the exposure apparatus along with special materials to minimize air entrapment during creation of a vacuum to ensure intimate contact. Additionally care must be taken to ensure all surfaces of the photopolymer plate and phototool are clean and free of dust and dirt. Presence of such foreign matter can cause lack of intimate contact between the phototool and plate as well as image artifacts.

An alternative to analog workflow is termed digital workflow, which does not require the preparation of a separate phototool. Photosensitive elements suitable for use as the precursor and processes capable of forming an in-situ mask in digital workflow are described in U.S. Pat. Nos. 5,262,275; U.S. 5,719,009; U.S. 5,607,814; U.S. 6,238,837; U.S. 6,558,876; U.S. 6,929,898; U.S. 6,673,509; U.S. 5,607,814; U.S. 6,037,102; and U.S. 6,284,431. The precursor or an assemblage with the precursor includes a layer sensitive to laser radiation, typically infrared laser radiation, and opaque to actinic radiation. The infrared-sensitive layer is imagewise exposed with laser radiation whereby the infrared-sensitive material is removed from, or transferred onto/from a superposed film of the assemblage, to form the in-situ mask having radiation opaque areas and clear areas adjacent the photopolymerizable layer. The precursor is exposed through the in-situ mask to actinic radiation in the presence of atmospheric oxygen (since no vacuum is needed). Furthermore, due in part to the presence of atmospheric oxygen during imagewise exposure the flexographic printing form has a relief structure that is different from the relief structure formed in analog workflow (based upon the same size mask openings in both workflows). Digital workflow creates a raised element (i.e., dot) in the relief structure having a surface area of its uppermost surface (i.e., printing surface) that is significantly less than the opening in the in-situ mask corresponding to the relief structure. Digital workflow results in the relief image having a different structure for dots (i.e., raised surface elements) that is typically smaller, with a rounded top, and a curved sidewall profile, often referred to as dot sharpening effect. Dots produced by analog workflow are typically conical and have a flat-top. The relief structure formed by digital workflow results in positive printing properties such as, finer printed highlight dots fading into white, increased range of printable tones, and sharp linework. As such, the digital workflow because of its ease of use and desirable print performance has gained wide acceptance as a desired method by which to produce the flexographic printing form. But not all end-use applications view this dot-sharpening effect as beneficial.

It is known by those skilled in the art that the presence of oxygen ($O_2$) during exposure in free-radical photopolymerization processes will induce a side reaction in which the free radical molecules react with the oxygen, while the primary reaction between reactive monomer molecules occurs. This side reaction is known as inhibition (i.e., oxygen inhibition) as it slows down the polymerization or formation of crosslinked molecules. Many prior disclosures acknowledge that it is desirable for photopolymerization exposure to actinic radiation to occur in air (as is the case for digital workflow), under vacuum (as is the case for analog workflow), or in an inert environment. Oftentimes, nitrogen is mentioned as a suitable inert gas for the inert environment. The implication is that the nitrogen environment is one that contains substantially less than atmospheric oxygen to the extent that all oxygen is removed, or something less than about 10 ppm of oxygen. Nitrogen with oxygen impurity concentration level less than 10 ppm is readily commercially available.

The effect of oxygen associated with digital workflow can impact the ability to hold solid screen patterns in solid printing areas of the relief printing form. It is often desirable for an image that is printed by flexographic relief printing form to increase the density of ink in solid areas of the image, so-called solid ink density. Solid screening is a well-known process for improving the solid ink density in flexographic printing, and is described for instance in U.S. Pat. No. 6,492,095; and U.S. Patent Publication US 2010/0143841. Solid screening consists of creating a pattern in the solid printing areas which is small enough that the pattern is not reproduced in the printing process (i.e., printed image), and large enough that the pattern is substantially different from the normal, i.e., unscreened, printing surface. Often these screening patterns are features in the range of 5 to 30 microns. The inhibition effect of the atmospheric oxygen during imagewise exposure of a photosensitive element for relief printing can result in pattern features being reduced in size by about 15 microns on each edge. Consequently this reduction in feature size, a 30 micron feature will be reduced to a 0 micron feature size for example, limits relief printing form to print increased solid ink densities.

There is also a desire to transition from solvent development to thermal development in the fabrication of solid plates, due to the environmental and economic advantages of thermal development. However, a problem sometimes arises with thermal processing in that the uncured photopolymer is not always adequately cleaned out or removed from recessed areas of the relief surface of the printing element. Inadequate clean out of recessed areas can manifest as insufficient removal of photopolymer material to the relief depth desired and/or as a non-uniformity of relief depth between open floor areas and in relatively narrow channels or gaps between large raised areas (i.e., typically solid printing areas). Relief depth is the difference between thickness of a floor of cured polymer and the thickness of the printing layer in the printing element. While in general it is particularly difficult to adequately clean out or remove uncured photopolymer material in relief printing forms in which the photopolymerizable layer has a thickness greater than about 100 mil, it can be difficult to remove uncured material from recessed areas of the relief surface even for relief printing forms in which the photopolymerizable layer has a thickness less than 100 mil. In particular, relief printing forms that are prepared from photosensitive elements using analog workflow and thermal development can exhibit inadequate clean out.

In general, relief printing forms that are prepared from photosensitive elements using digital workflow and solvent development exhibit suitable relief depth and uniformity in open floor areas and narrow channels or gaps between solid printing areas, and do not encounter the problem of inadequate clean out or removal from recessed areas of the relief surface.

Relief printing forms having incomplete clean out or removal of recessed areas of the relief surface can result in poor print performance, that is, poor reproduction of the image printed on the substrate. Relief printing is a method of printing in which the printing form prints from an image area, where the image area of the printing form is raised and the non-image area is depressed or recessed. Recessed areas, such as the floor, that are not cleaned out sufficiently are shallow, and thus can pick up ink and contact to transfer the ink onto the substrate in regions that are not to be printed. This is sometimes referred to as "printing the floor". In other instances, small dirt particles or lint can cling to the shallow recessed areas, pickup ink, and transfer ink (with or without the dirt particle) to the substrate, which can render the printed image "dirty". This effect of printing shallow floors or dirt can be exacerbated since the printing form is often in pressure contact with the substrate.

There is also a desire to eliminate the costs and the time consuming and problematic process steps associated with the preparation of the photographic negative intermediate, and transition from analog workflow to digital workflow in the fabrication of solid plates. However, the dot-sharpening effect associated with conventional digital exposure in the presence of atmospheric oxygen becomes a disadvantage for printing forms that are thermally treated to form the relief. Because imagewise exposure in digital workflow is conducted in the presence of atmospheric oxygen which inhibits polymerization, the dot structure of the raised surface element has a printable surface area that is considerably reduced (compared to that produced by analog workflow, as well as compared to the corresponding opening in the digital mask image). Moreover, fine raised surface elements associated with printing of the highlights of an image, for example, raised surface elements representing less than or equal to about 3% dots, may have insufficient height above the floor, may be warped, or may be bent such that the printing result is deemed to be deficient. As such, it is desirable to fabricate a relief printing form using digital workflow due to its ease and simplicity, while providing a relief surface in the printing form that is capable of printing detailed fine highlights in halftone images and/or clean fine text and line graphics. Further, it is desirable to fabricate a relief printing form by thermal processing instead of solvent processing, but to attain thermally-developed printing forms having relief structure of images and graphics that is comparable or substantially comparable to the relief structure of printing forms prepared by solvent processing.

Thus, the need to use digital workflow and thermal development in the fabrication of relief printing forms conflicts with the need for the printing form to have a relief surface that is capable of printing desired images and graphics with clean open areas, fine text and line graphics, as well as the full range of halftone images from dark shadows to fine highlights. The relief printing form should also be capable of holding solid screen patterning in solid areas for printing solid ink areas with increased density. So a need arises for a method of fabricating a relief printing form from a photosensitive precursor element that utilizes digital workflow to eliminate the costly and problematic creation of a separate intermediate, and that utilizes thermal development to reduce the time to prepare the printing form. The relief printing form needs to have a relief structure composed of recessed areas and raised areas for forming a pattern of printing regions on a substrate that contain detailed fine highlights in halftone images, clean open areas between raised areas, and/or clean fine text and line graphics.

SUMMARY OF THE INVENTION

In accordance with this invention there is provided a method for preparing a relief printing form from a photosensitive element, including the steps of (a) forming an in-situ mask disposed above a layer of a photopolymerizable composition in the photosensitive element, wherein the photopolymerizable composition comprises a binder, an ethylenically unsaturated compound and a photoinitiator; (b) exposing the photopolymerizable layer to actinic radiation through the mask in an environment having an inert gas and a concentration of oxygen between 50,000 ppm and 2000 ppm, forming at least a polymerized portion and at least an unpolymerized portion; and, (c) treating by heating the photosensitive element of step b) to a temperature sufficient to cause the unpolymerized portion to melt, flow, or soften.

BRIEF DESCRIPTION OF THE DRAWINGS

The invention can be more fully understood from the following detailed description thereof in connection with the accompanying drawing described as follows:

FIG. 1Aa is a reproduction of a photograph taken of a portion of a first printing plate at a line screen resolution of 120 lines per inch (lpi) as described above, wherein the first plate was prepared by exposing in the environment containing nitrogen and 1% concentration of oxygen, and thermally treating.

FIG. 1Ab is a reproduction of a photograph taken of a portion of the first printing plate at a line screen resolution of 133 lines per inch (lpi) as described above, wherein the first plate was prepared by exposing in the environment containing nitrogen and 1% concentration of oxygen, and thermally treating.

FIG. 1Ac is a reproduction of a photograph taken of a portion of the first printing plate at a line screen resolution of 150 lines per inch (lpi) as described above, wherein the first plate was prepared by exposing in the environment containing nitrogen and 1% concentration of oxygen, and thermally treating.

FIG. 1Ad is a reproduction of a photograph taken of a portion of the first printing plate at a line screen resolution of 171 lines per inch (lpi) as described above, wherein the plate was prepared by exposing in the environment containing nitrogen and 1% concentration of oxygen, and thermally treating.

FIG. 1Bb is a reproduction of a photograph taken of a portion of the second printing plate at a line screen resolution of 133 lines per inch (lpi) as described above, wherein the second plate was prepared by exposing in the environment containing nitrogen and 0.5% concentration of oxygen, and thermally treating.

FIG. 1Bc is a reproduction of a photograph taken of a portion of the second printing plate at a line screen resolution of 150 lines per inch (lpi) as described above, wherein the second plate was prepared by exposing in the environment containing nitrogen and 0.5% concentration of oxygen, and thermally treating.

FIG. 1Bd is a reproduction of a photograph taken of a portion of the second printing plate at a line screen resolution of 171 lines per inch (lpi) as described above, wherein the second plate was prepared by exposing in the environment containing nitrogen and 0.5% concentration of oxygen, and thermally treating.

FIG. 1Cb is a reproduction of a photograph taken of a portion of the third printing plate at a line screen resolution of 133 lines per inch (lpi) as described above, wherein the third plate was prepared by exposing in the environment containing nitrogen and 0.1% concentration of oxygen, and thermally treating.

FIG. 1Cc is a reproduction of a photograph taken of a portion of the third printing plate at a line screen resolution of 150 lines per inch (lpi) as described above, wherein the third plate was prepared by exposing in the environment containing nitrogen and 0.1% concentration of oxygen, and thermally treating.

FIG. 2Aa is a reproduction of a photograph taken of a print sample at the line screen resolution of 133 lines per inch (lpi) as described above.

FIG. 2Ab is a reproduction of a photograph taken of a print sample at the line screen resolution of 150 lines per inch (lpi) as described above.

FIG. 2Ac is a reproduction of a photograph taken of a print sample at the line screen resolution of 171 lines per inch (lpi) as described above.

FIG. 2Be through FIG. 2Bh are reproductions of photographs taken of portions of a printing plate (67DFH), in which each portion of the plate is a field of 1 pixel dots that correspond with a screen area having specific line screen resolution provided by an in-situ mask for a photosensitive element, wherein a printing plate was prepared from a photosensitive element by imagewise exposing the element in an environment of an inert gas and having less than 0.01% oxygen such that the environment was considered to contain substantially only nitrogen, and thermally treating as described for Control A in Example 1.

FIG. 2Ba is a reproduction of a photograph taken of the print sample at the line screen resolution of 120 lines per inch (lpi) as described above.

FIG. 2Bb is a reproduction of a photograph taken of the print sample at the line screen resolution of 133 lines per inch (lpi) as described above.

FIG. 2Bc is a reproduction of a photograph taken of the print sample at the line screen resolution of 150 lines per inch (lpi) as described above.

FIG. 2Bd is a reproduction of a photograph taken of the print sample at the line screen resolution of 171 lines per inch (lpi) as described above.

FIG. 2Be is a reproduction of a photograph taken of a portion of a printing plate at a line screen resolution of 120 lines per inch (lpi) for Control A as described above. This portion of the plate shown in FIG. 2Be printed the image shown in FIG. 2Ba.

FIG. 2Bf is a reproduction of a photograph taken of a portion of a printing plate at a line screen resolution of 133 lines per inch (lpi) for Control A as described above. This portion of the plate shown in FIG. 2Bf printed the image shown in FIG. 2Bb.

FIG. 2Bg is a reproduction of a photograph taken of a portion of a printing plate at a line screen resolution of 150 lines per inch (lpi) for Control A as described above. This portion of the plate shown in FIG. 2Bg printed the image shown in FIG. 2Bc.

FIG. 2Bh is a reproduction of a photograph taken of a portion of a printing plate at a line screen resolution of 171 lines per inch (lpi) for Control A as described above. This portion of the plate shown in FIG. 2Bh printed the image shown in FIG. 2Bd.

FIG. 3Aa is a reproduction of a photograph taken of a text character "4" from a first printing plate as described above, wherein the first plate was prepared by exposing in the environment containing nitrogen and 1% concentration of oxygen, and thermally treating.

FIG. 3Ab is a reproduction of a photograph taken of a text character "8" from the first printing plate as described above, wherein the first plate was prepared by exposing in the environment containing nitrogen and 1% concentration of oxygen, and thermally treating.

FIG. 3Ac is a reproduction of a photograph taken of a text character "A" from the first printing plate as described above, wherein the first plate was prepared by exposing in the environment containing nitrogen and 1% concentration of oxygen, and thermally treating.

FIG. 3Ad is a reproduction of a photograph taken of a text character "B" from the first printing plate as described above, wherein the first plate was prepared by exposing in the environment containing nitrogen and 1% concentration of oxygen, and thermally treating.

FIG. 3Bb is a reproduction of a photograph taken of a text character "8" from a printing plate as described above, wherein the second plate was prepared by exposing in the environment containing nitrogen and 0.5% concentration of oxygen, and thermally treating.

FIG. 3Bc is a reproduction of a photograph taken of a text character "A" from the second printing plate as described above, wherein second plate was prepared by exposing in the environment containing nitrogen and 0.5% concentration of oxygen, and thermally treating.

FIG. 3Bd is a reproduction of a photograph taken of a text character "B" from a printing plate as described above, wherein the second plate was prepared by exposing in the environment containing nitrogen and 0.5% concentration of oxygen, and thermally treating.

FIG. 3Cb is a reproduction of a photograph taken of a text character "8" from the third printing plate as described above, wherein the third plate was prepared by exposing in the environment containing nitrogen and 0.1% concentration of oxygen, and thermally treating.

FIG. 3Cc is a reproduction of a photograph taken of a text character "A" from the third printing plate as described above, wherein the third plate was prepared by exposing in the environment containing nitrogen and 0.1% concentration of oxygen, and thermally treating.

FIG. 3Cd is a reproduction of a photograph taken of a text character "B" from the third printing plate as described above, wherein the third plate was prepared by exposing in the environment containing nitrogen and 0.1% concentration of oxygen, and thermally treating.

FIG. 4Ab is a chart representing the shape and depth of a recessed portion associated with the raised element (i.e., relief) of the text character taken along the measurement vector indicated by the arrow shown in FIG. 4Aa. The maximum depth of the recessed portion, i.e., the cleanout depth, along the measurement vector was 87 microns for the text character shown in FIG. 4Aa.

FIG. 4Bb is a chart representing the shape and depth of a recessed portion associated with the raised element (i.e., relief) of the second text character taken along the measurement vector indicated by the arrow shown in FIG. 4Ba. The maximum depth of the recessed portion, i.e., the cleanout depth, along the measurement vector was 122 microns for the text character shown in FIG. 4Ba.

FIG. 4Cb is a chart representing the shape and depth of a recessed portion associated with the raised element (i.e., relief) of the text character taken along the measurement vector indicated by the arrow shown in FIG. 4Ca. The maximum depth of the recessed portion, i.e., the cleanout depth, along the measurement vector was 65 microns for the text character shown in FIG. 4Ca.

FIG. 4Db is a chart representing the shape and depth of a recessed portion associated with the raised element (i.e., relief) of the text character taken along the measurement vector indicated by the arrow shown in FIG. 4Da. The maximum depth of the recessed portion, i.e., the cleanout depth, along the measurement vector was 90 microns for the text character shown in FIG. 4Da.

FIG. 5Ab is a chart representing the shape and depth of a recessed portion associated with the raised element (i.e., relief) of the text character taken along the measurement vector indicated by the arrow shown in FIG. 5Aa. The maximum depth of the recessed portion, i.e., the cleanout depth, along the measurement vector was 42 microns for the text character shown in FIG. 5Aa.

FIG. 5Bb is a chart representing the shape and depth of a recessed portion associated with the raised element (i.e., relief) of the second text character taken along the measurement vector indicated by the arrow shown in FIG. 5Ba. The maximum depth of the recessed portion, i.e., the cleanout depth, along the measurement vector was 58 microns for the text character shown in FIG. 5Ba.

FIG. 5Cb is a chart representing the shape and depth of a recessed portion associated with the raised element (i.e., relief) of the text character taken along the measurement vector indicated by the arrow shown in FIG. 5Ca. The maximum depth of the recessed portion, i.e., the cleanout depth, along the measurement vector was 15 microns for the text character shown in FIG. 5Ca.

FIG. 5Db is a chart representing the shape and depth of a recessed portion associated with the raised element (i.e., relief) of the second text character taken along the measurement vector indicated by the arrow shown in FIG. 5Da. The maximum depth of the recessed portion, i.e., the cleanout depth, along the measurement vector was 28 microns for the text character shown in FIG. 5Da.

FIG. 6Aa is a reproduction of a photograph taken of a portion of a first printing plate at a line screen resolution of 133 lines per inch (lpi) as described above, wherein the first plate was prepared by exposing in the environment containing nitrogen and 1% concentration of oxygen, and thermally treating.

FIG. 6Ab is a reproduction of a photograph taken of a portion of the first printing plate at a line screen resolution of 150 lines per inch (lpi) as described above, wherein the plate was prepared by exposing in the environment containing nitrogen and 1% concentration of oxygen, and thermally treating.

FIG. 6Ac is a reproduction of a photograph taken of a portion of the printing plate at a line screen resolution of 171 lines per inch (lpi) as described above, wherein the plate was prepared by exposing in the environment containing nitrogen and 1% concentration of oxygen, and thermally treating.

FIG. 6Bb is a reproduction of a photograph taken of a portion of the second printing plate at a line screen resolution of 150 lines per inch (lpi) as described above, wherein the plate was prepared by exposing in the environment containing nitrogen and 0.5% concentration of oxygen, and thermally treating.

FIG. 6Bc is a reproduction of a photograph taken of a portion of the second printing plate at a line screen resolution of 171 lines per inch (lpi) as described above, wherein the plate was prepared by exposing in the environment containing nitrogen and 0.5% concentration of oxygen, and thermally treating.

FIG. 6Cb is a reproduction of a photograph taken of a portion of the third printing plate at a line screen resolution of 133 lines per inch (lpi) as described above, wherein the plate was prepared by exposing in the environment containing nitrogen and 0.1% concentration of oxygen, and thermally treating.

FIG. 6Cc is a reproduction of a photograph taken of a portion of the third printing plate at a line screen resolution of 150 lines per inch (lpi) as described above, wherein the plate was prepared by exposing in the environment containing nitrogen and 0.1% concentration of oxygen, and thermally treating.

FIG. 7Aa is a reproduction of a photograph taken of a text character "4" from a first printing plate as described above, wherein the first plate was prepared by exposing in the environment containing nitrogen and 1% concentration of oxygen, and thermally treating.

FIG. 7Ab is a reproduction of a photograph taken of a text character "8" from the first printing plate as described above, wherein first plate was prepared by exposing in the environment containing nitrogen and 1% concentration of oxygen, and thermally treating.

FIG. 7Ac is a reproduction of a photograph taken of a text character "A" from the first printing plate as described above, wherein the first plate was prepared by exposing in the environment containing nitrogen and 1% concentration of oxygen, and thermally treating.

FIG. 7Ad is a reproduction of a photograph taken of a text character "B" from the first printing plate as described above, wherein the first plate was prepared by exposing in the environment containing nitrogen and 1% concentration of oxygen, and thermally treating.

FIG. 7Bb is a reproduction of a photograph taken of a text character "8" from the second printing plate as described above, wherein the second plate was prepared in the environment containing nitrogen and 0.5% concentration of oxygen, and thermally treating.

FIG. 7Bc is a reproduction of a photograph taken of a text character "A" from the second printing plate as described above, wherein the second plate was prepared by exposing in the environment containing nitrogen and 0.5% concentration of oxygen, and thermally treating.

FIG. 7Bd is a reproduction of a photograph taken of a text character "B" from the second printing plate as described above, wherein the second plate was prepared by exposing in the environment containing nitrogen and 0.5% concentration of oxygen, and thermally treating.

FIG. 7Cb is a reproduction of a photograph taken of a text character "8" from the third printing plate as described above, wherein the third plate was prepared by exposing in the environment containing nitrogen and 0.1% concentration of oxygen, and thermally treating.

FIG. 7Cc is a reproduction of a photograph taken of a text character "A" from the third printing plate as described above, wherein the third plate was prepared by exposing in the environment containing nitrogen and 0.1% concentration of oxygen, and thermally treating.

FIG. 7Cd is a reproduction of a photograph taken of a text character "B" from the third printing plate as described above, wherein the third plate was prepared by exposing in the environment containing nitrogen and 0.1% concentration of oxygen, and thermally treating.

FIG. 8Ab is a chart representing the shape and depth of a recessed portion associated with the raised element (i.e., relief) of the text character taken along the measurement vector indicated by the arrow shown in FIG. 8Aa. The maximum depth of the recessed portion, i.e., the cleanout depth, along the measurement vector was 99 microns for the text character shown in FIG. 8Aa.

FIG. 8Bb is a chart representing the shape and depth of a recessed portion associated with the raised element (i.e., relief) of the second text character taken along the measurement vector indicated by the arrow shown in FIG. 8Ba. The maximum depth of the recessed portion, i.e., the cleanout depth, along the measurement vector was 130 microns for the text character shown in FIG. 8Ba.

FIG. 8Cb is a chart representing the shape and depth of a recessed portion associated with the raised element (i.e., relief) of the text character taken along the measurement vector indicated by the arrow shown in FIG. 8Ca. The maximum depth of the recessed portion, i.e., the cleanout depth, along the measurement vector was 79 microns for the text character shown in FIG. 8Ca.

FIG. 8Db is a chart representing the shape and depth of a recessed portion associated with the raised element (i.e., relief) of the second text character taken along the measurement vector indicated by the arrow shown in FIG. 8Da. The maximum depth of the recessed portion, i.e., the cleanout depth, along the measurement vector was 111 microns for the text character shown in FIG. 8Da.

FIG. 9Ab is a chart representing the shape and depth of a recessed portion associated with the raised element (i.e., relief) of the text character taken along the measurement vector indicated by the arrow shown in FIG. 9Aa. The maximum depth of the recessed portion, i.e., the cleanout depth, along the measurement vector was 60 microns for the text character shown in FIG. 9Aa.

FIG. 9Bb is a chart representing the shape and depth of a recessed portion associated with the raised element (i.e., relief) of the second text character taken along the measurement vector indicated by the arrow shown in FIG. 9Ba. The maximum depth of the recessed portion, i.e., the cleanout depth, along the measurement vector was 55 microns for the second text character shown in FIG. 9Ba.

FIG. 10Aa is a reproduction of a photograph taken of the print sample containing a text character "4" on a substrate that was printed from a printing plate (67DFH) prepared by imagewise exposing in the environment containing nitrogen and 1% concentration of oxygen, and thermally developing as described in Example 2.

FIG. 10Ab is a reproduction of a photograph taken of the print sample containing a text character "8" on a substrate that was printed from the printing plate (67DFH) prepared by imagewise exposing in the environment containing nitrogen and 1% concentration of oxygen, and thermally developing as described in Example 2.

FIG. 10Bb is a reproduction of a photograph taken of the print sample containing a text character "8" on a substrate that was printed from the another printing plate (67DFH) described as Control A in Example 1, wherein the plate was prepared by imagewise exposing in the environment of an inert gas and having less than 0.01% oxygen such that the environment was considered to contain substantially only nitrogen, and thermally treating.

DESCRIPTION OF THE PREFERRED EMBODIMENTS

Figure 1A:
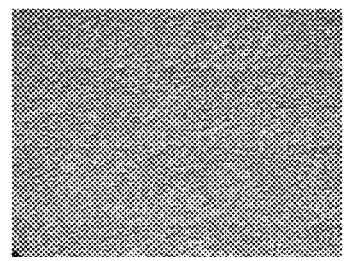
FIG. 1Aa through FIG. 1Ad, FIG. 1Ba through FIG. 1Bd, and FIG. 1Ca through FIG. 1Cc are reproductions of photographs taken of portions of a printing plate (67DFH), in which each portion of the plate is a field of 1 pixel dots that correspond with a screen area having specific line screen resolution provided by an in-situ mask for a photosensitive element, wherein each of three printing plates were prepared from each of three photosensitive elements by imagewise exposing each element in a specific environment containing an inert gas (i.e., nitrogen) and concentration of oxygen as indicated, and thermally developing as described in Example 1.
Figure 1A:
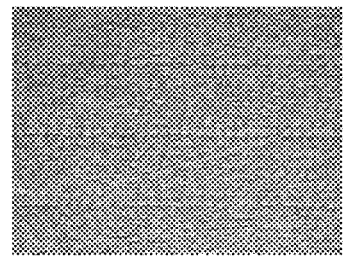
Figure 1A:
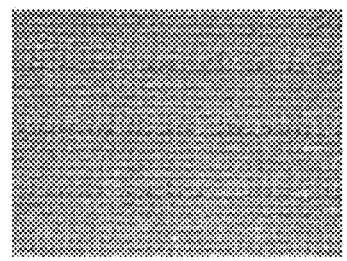
Figure 1A:
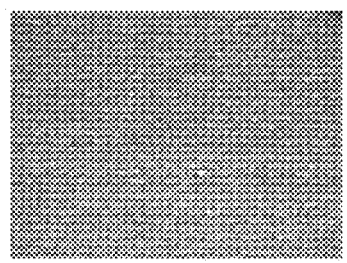

Throughout the following detailed description, similar reference characters refer to similar elements in all figures of the drawings.

The present invention is a method for preparing a printing form from a photosensitive element, and in particular to a method for forming a relief printing form from the photosensitive element. In most embodiments the printing form includes a relief pattern that is particularly suited for relief printing, including use as a flexographic printing form and letterpress printing form. Relief printing is a method of printing in which the printing form prints from an image area, where the image area of the printing form is raised and the non-image area is depressed. In some embodiments, the printing form is suited for gravure or gravure-like printing. Gravure printing is a method of printing in which the printing form prints from an image area, where the image area is depressed and consists of small recessed cups or wells to contain the ink or printing material, and the non-image area is the surface of the form. Gravure-like printing is similar to gravure printing except that a relief printing form is used wherein the image area is depressed and consists of recesses areas forming wells to carry the ink which transfer during printing. The method prepares a printing form with a relief structure composed of recessed areas and raised areas for forming patterns of printing regions on a substrate that contain detailed fine highlights in halftone images, clean open areas between the raised areas and recessed areas, and clean fine text and line-graphics. Also, the method prepares a relief printing form that is capable of holding solid screen patterning of fine features in solid areas for printing solid ink areas with increased density. The relief printing form is prepared from a photosensitive precursor element that utilizes digital workflow to eliminate the costly and problematic creation of a separate intermediate, and utilizes thermal development to reduce the time to prepare the printing form.

It has surprisingly and unexpectedly been found that a relief printing form having both raised printing surfaces of sufficient structure and open or recessed areas of adequate depth and without loss of screen patterning in solid areas can be achieved with a digital workflow-like process (i.e., modified digital workflow) in which the photosensitive element is imagewise exposed in an environment having an inert gas and a concentration of oxygen less than atmospheric but greater than a completely inert gas environment, that is in particular, in an environment having an inert gas and a concentration of oxygen between about 50,000 and about 2000 parts per million (ppm), and thermal development. The raised surface elements are sufficiently structured such that highlight dots of 10 to 12.5 micron (micrometers) in diameter are formed. Highlight dots of this diameter are in the range of diameters required to print detailed fine highlights in halftone images. The present method provides the printing form with the raised printing surfaces composed of fine raised surface elements, in which each raised surface element is well-characterized by its conical shape and has a flat or substantially flat top surface area sufficient to accurately reproduce the desired image on the substrate. No longer is the relief structure in a relief printing form fabricated by digital workflow limited by oxygen inhibition effect on the photopolymerizable layer. The present invention provides for the capability to create the relief surface of the raised surface elements on the printing form that essentially is the recreation of the in-situ mask image, particularly in terms of size of openings in mask relative to the size of the raise surface element (e.g., halftone dot). The present invention avoids the cost and production disadvantages associated with analog workflow, and capitalizes on the efficiencies of digital workflow while avoiding the difficulty of establishing a completely inert environment.

A method for providing a relief printing form from a photosensitive element includes forming an in-situ mask adjacent to a layer of a photopolymerizable composition of the photosensitive element, exposing the photopolymerizable layer of the photosensitive element to actinic radiation through the in-situ mask in an environment having an inert gas and a concentration of oxygen between 50,000 and 2000 parts per million (ppm) forming a polymerized portion and an unpolymerized portion, and treating by heating the exposed element to a temperature sufficient to cause unpolymerized portion to melt, flow or soften. In some embodiments, the unpolymerized portion is removed to form the relief printing form to provide recessed areas and form a pattern of raised areas of polymerized material for printing. The photosensitive element includes a layer of a photopolymerizable composition composed of at least a binder, an ethylenically unsaturated compound, and a photoinitiator. In most embodiments the photopolymerizable layer is on or adjacent to a support. The photosensitive element for use in the present invention is not limited, provided that the photosensitive element is capable of having an in-situ mask disposed above the photopolymerizable layer, that is, an in-situ mask on or adjacent the photopolymerizable layer. The in-situ mask is an image or pattern of opaque areas and transparent areas that is integral or substantially integral with the photosensitive element for imagewise exposure to actinic radiation, and does not need vacuum to assure contact of the mask to the photopolymerizable layer. The in-situ mask avoids the drawbacks associated with generating a separate phototool and using vacuum to assure contact of the phototool to the photosensitive layer when making the relief printing form.

The method includes forming an in-situ mask adjacent to the photopolymerizable layer. In most embodiments, the in-situ mask, or simply mask, has a plurality of openings through an area opaque to actinic radiation disposed above the photopolymerizable layer. The in-situ mask image is disposed above the photopolymerizable layer when the mask is formed on or adjacent the surface of the photopolymerizable layer that is opposite a side of the photopolymerizable layer having the support. The mask includes a pattern of opaque areas and openings of transparent or "clear" areas, which is the graphic information that is to be printed by the print form. The opaque areas of the mask prevent the photopolymerizable material beneath from being exposed to the radiation (i.e., actinic radiation opaque areas) and hence those areas of the photopolymerizable layer covered by the dark areas do not polymerize, i.e., unpolymerized portions. The "clear" areas of the mask expose the photopolymerizable layer to actinic radiation and polymerize or crosslink the underlying portions of the photopolymerizable layer. The clear areas of the mask form the plurality of openings through an area opaque to actinic radiation. The mask associated with the photosensitive element ultimately creates a pattern of relief structure of the photopolymerizable layer, in which the relief structure includes the raised surfaces of the well-structured, fine, raised surface elements that are the printing surface areas for a relief printing form.

Further, in some embodiments, the mask includes in the clear or open areas a pattern of a plurality of features in which each feature has a dimension between about 5 and about 30 micron that is opaque or substantially opaque to actinic radiation. In some embodiments, the actinic radiation opaque features are spaced from each other (center-to-center) at dimensions from about 5 to about 30 microns. This pattern of actinic radiation opaque features is sometimes referred to as solid screening, or as a microcell pattern. The pattern of plurality of actinic radiation opaque features is not limited, and need not be a regular or repeatable pattern. The microcell patterning is associated with software for the laser imaging devices that form the in-situ mask. In most embodiments, a microcell pattern is induced into printing surface area of the print form that will print solid ink areas. Advantageously, the present method can reproduce the microcell pattern of plurality of features as a plurality of recessed areas on the printing surface area of the printing form that prints continuous or substantially continuous area of ink on the substrate, so-called solid areas, to provide desired density of solid ink coverage.

The method by which the in-situ mask is formed with an actinic radiation opaque material is not limited. The in-situ mask can be generated by any suitable method, including digital direct-to-plate methods using laser radiation (often referred to as digital methods or digital workflow), and inkjet application, that is conducted prior to imagewise exposure of the photosensitive element to actinic radiation. The actinic radiation opaque layer is employed in digital direct-to-plate image technology in which laser radiation, typically infrared laser radiation, is used to form a mask of the image for the photosensitive element (instead of the conventional image transparency or phototool). Generally, digital methods of in-situ mask formation use laser radiation to either selectively remove or transfer a radiation opaque material, from or to a surface of the photosensitive element opposite the support. Digital methods of creating the mask image require one or more steps to prepare the photosensitive element prior to imagewise exposure. In most embodiments the method is used to print graphic information or images, which can include text features, line features, and halftone illustrations. For halftone illustrations the openings created in the mask typically have a dot area that can range from 2 to 99%. The dot area for each of the raised surface elements of the raised printing areas will vary according to the requirements of the graphic image being printed. In most embodiments, the plurality of openings in the in-situ mask has a line screen resolution of less than 250 lines per inch (lpi) so that graphic images with desired highlight dot resolution can be printed. Typical line screen resolution used for creating halftone images for relief printing forms includes, but is not limited to, 120 lpi, 133 lpi, 150 lpi, and 171 lpi.

In one embodiment, the photosensitive element initially includes an actinic radiation opaque layer disposed on or above a surface of the photopolymerizable layer opposite the support, and laser radiation imagewise removes, i.e., ablates or vaporizes, the radiation opaque layer to form the in-situ mask. Only the portions of the radiation opaque layer that were not removed from the photosensitive element will remain on the element to create the mask.

In another embodiment, the photosensitive element will not initially include the actinic radiation opaque layer. A separate element bearing the radiation opaque layer will form an assemblage with the photosensitive element such that the radiation opaque layer is adjacent the surface of the photosensitive element opposite the support. The assemblage is exposed imagewise with laser radiation to selectively transfer or selectively alter the adhesion balance of the radiation opaque layer and form the mask image on or disposed above the photopolymerizable layer. In this embodiment, only the transferred portions of the radiation opaque layer reside on the photosensitive element forming the in-situ mask.

It is contemplated that digital mask formation could also be accomplished by imagewise application of the radiation opaque material in the form of inkjet inks on the photosensitive element. Imagewise application of ink-jet ink can be directly on the photopolymerizable layer or disposed above the photopolymerizable layer on another layer of the photosensitive element.

Another contemplated embodiment for forming the in-situ mask is by creating the mask image of the radiation opaque layer on a separate carrier. In some embodiments, the separate carrier includes a radiation opaque layer that is imagewise exposed to laser radiation to selectively remove the radiation opaque material and form the image. The mask image on the carrier is then transferred with application of heat and/or pressure to the surface of the photopolymerizable layer opposite the support. The photopolymerizable layer is typically tacky and will retain the transferred image. The separate carrier can then be removed from the element prior to imagewise exposure.

In some embodiments, the laser radiation used to form the mask is infrared laser radiation. The infrared laser exposure can be carried out using various types of infrared lasers, which emit in the range 750 to 20,000 nm. Infrared lasers including diode lasers emitting in the range 780 to 2,000 nm and Nd—YAG lasers emitting at 1064 nm are preferred. A preferred apparatus and method for infrared laser exposure to imagewise remove the actinic radiation opaque layer from the photosensitive element is disclosed by Fan et al. in U.S. Pat. Nos. 5,760,880 and 5,654,125. The in situ mask image remains on the photosensitive element for the subsequent step of overall exposure to actinic radiation.

The next step of the method to prepare a relief printing form is to overall expose the photosensitive element to actinic radiation through the in-situ mask, that is, imagewise exposure of the element. Imagewise exposure of the photosensitive element to actinic radiation is conducted in an environment that includes the presence of an inert gas and an oxygen concentration of about 50,000 to about 2000 part per million (ppm). The inert gas is a gas that exhibits no or a low reaction rate with the photosensitive element (that is, inert to the polymerization reaction), and is capable of displacing oxygen in the exposure environment. Suitable inert gases include, but are not limited to, argon, helium, neon, krypton, xenon, nitrogen, carbon dioxide, and combinations thereof. In one embodiment, the inert gas is nitrogen.

Imagewise exposure of the photosensitive element to actinic radiation can be conducted in an environment that includes the presence of an inert gas and an oxygen concentration between, and optionally including, any two of the following values: 55,000; 50,000; 45,000; 40,000; 35,000; 30,000; 25,000; 20,000; 15,000; 10,000; 9,000; 8,000; 7,000; 6,000; 5,000; 4,000; 3,000; 2,000 ppm. In some embodiments, imagewise exposure of the photosensitive element to actinic radiation is conducted in an environment that includes the presence of an inert gas and an oxygen concentration of about 50,000 to about 2000 ppm. In some embodiments, imagewise exposure of the photosensitive element to actinic radiation is conducted in an environment that includes the presence of an inert gas and an oxygen concentration of about 40,000 to about 2000 ppm. In some embodiments, imagewise exposure of the photosensitive element to actinic radiation is conducted in an environment that includes the presence of an inert gas and an oxygen concentration of about 30,000 to about 2000 ppm. In some embodiments, imagewise exposure of the photosensitive element to actinic radiation is conducted in an environment that includes the presence of an inert gas and an oxygen concentration of about 25,000 to about 2000 ppm. In some embodiments, imagewise exposure of the photosensitive element to actinic radiation is conducted in an environment that includes the presence of an inert gas and an oxygen concentration of about 20,000 to about 2000 ppm. In some embodiments, imagewise exposure of the photosensitive element to actinic radiation is conducted in an environment that includes the presence of an inert gas and an oxygen concentration of about 50,000 to about 5000 ppm. In some embodiments, imagewise exposure of the photosensitive element to actinic radiation is conducted in an environment that includes the presence of an inert gas and an oxygen concentration of about 50,000 to about 10000 ppm.

Imagewise exposure of the photosensitive element to actinic radiation in the particular environment of inert gas and oxygen concentration between about 50,000 and about 2000 parts per million (ppm) (about 5% to about 0.2%) creates in the printing form (after thermal treatment) a relief structure of a plurality of raised surface elements each having a ink carrying top surface area that is structurally more similar to an ink carrying top surface area created in a printing form that can be prepared with analog workflow. That is, the top surface area of the raised surface elements in the relief printing form prepared according to the present method is flatter or substantially flat, and not as rounded as is typical of conventional digital workflow wherein the element is exposed in the presence of atmospheric oxygen. Further, imagewise exposure of the photosensitive element through the in-situ mask in an environment with the presence of an inert gas and oxygen concentration between about 50,000 and 2000 ppm provides for the capability to create raised surface printing elements that can be as fine as 10 to 12.5 microns at the printing surface. Depending on the set-up conditions of the printing press and equipment, a highlight dot having the same diameter may be printed on the substrate. Imagewise exposure of the photosensitive element in environments having an inert gas and a concentration of oxygen less than about 2000 ppm, creates a relief printing form having the well-structured features of the raised surface elements, but also having inadequate removal of the unpolymerized material from the support areas of the features and the recessed area/s of the photopolymerizable layer. Inadequate removal of polymerizable material in support areas of the features and the recessed areas can create printing forms that are more susceptible to picking up stray ink and/or dirt which can transfer onto the printed substrate in regions that are not to be printed, resulting in poor print quality by printing the floor or printing images that appear to be smeared or dirty. Imagewise exposure of the photosensitive element in environments having an inert gas and a concentration of oxygen greater than about 50,000 ppm, creates a relief printing form having adequate removal of unpolymerized material from recessed area/s, but small features, e.g., less than about 20 micron, such as recessed areas formed by microcell patterning in solid areas, may not be fully defined or formed. In this case, the recessed areas of microcell patterning are larger than the original mask image and can increase to such an extent that they essentially overlap eliminating space between the recessed areas, such that the features of the microcell patterning detail is lost or obscured. This most typically results in decrease in density of the ink in printed solid areas. Imagewise exposure of the photosensitive element through the in-situ mask in the presence of an inert gas and oxygen concentration between 50,000 and 2000 ppm can also faithfully reproduce or substantially reproduce the fine features of a screen pattern in solid areas of the relief to achieve desired increased ink density and/or other desirable print improvements. Imagewise exposure of the photosensitive element through the in-situ mask in the presence of an inert gas and oxygen concentration between 50,000 and 2000 ppm enables the use of digital workflow for mask creation yet counters the dot-sharpening effect caused by oxygen inhibition. Conventional digital workflow methods imagewise expose the photosensitive element to actinic radiation in air, which is 78% nitrogen, ~21% oxygen, <1% each argon and carbon dioxide, and trace amounts of other gases. In one embodiment, the photosensitive element does not include any additional layers on top of the in-situ mask, which additional layers may act as a barrier to the environment to the surface being imagewise exposed.

In one embodiment, the photosensitive element can be placed in an enclosure or chamber that is transparent to actinic radiation and adapted for placement on a bed of an exposure unit. One such embodiment of the enclosure is described in U.S. Patent Application Publication US 2009/0191483. In one embodiment, the enclosure can be sealed from external environment (room conditions) and includes an inlet port for introducing the inert gas into the enclosure and an outlet port for purging the air that is initially in the enclosure. A meter for measuring the concentration of oxygen within the enclosure may be located at the exit port.

In some embodiments, after the oxygen concentration has reached about 50,000 ppm or less in the enclosure, imagewise exposure is initiated and the oxygen concentration in the enclosure is continually reduced during imagewise exposure by continuous introduction of the inert gas into the enclosure. In some embodiments, imagewise exposure can begin when the concentration of oxygen is about at or below 50,000 ppm (5%), and continue as the oxygen concentration is reduced to about 2000 ppm (0.2%). In other embodiments after the oxygen concentration has reached between 50,000 ppm and 2000 ppm in the enclosure, imagewise exposure is initiated and the oxygen concentration in the environment in the enclosure is maintained or substantially maintained by continuously purging with a combination of the inert gas and oxygen at the desired concentration for the entirety of the exposure. In some embodiments, the environment for the photosensitive element during exposure has a concentration of oxygen that is an average of the oxygen concentration at the start of the imagewise exposure and the oxygen concentration at the end of the imagewise exposure, where the average oxygen concentration is between about 50,000 ppm and about 2000 ppm. In some other embodiments, the environment for the photosensitive element during imagewise exposure has a concentration of oxygen that is a weighted average of the oxygen concentration based on the percentage of time of the total exposure time, where the weighted average oxygen concentration is between about 50,000 ppm and about 2000 ppm.

The oxygen concentration range between and optionally including any two of the values as stated above represents an approximate oxygen concentration, as indicated by the use of the term "about" prior to any two values of a particular range. The oxygen concentration range of about a high value of the range to about a low value of the range can represent an actual range of oxygen concentration that is in some embodiments, plus or minus (±) 10%; in other embodiments plus or minus (±) 5%; and in yet other embodiments plus or minus (±) 2% of each of the high value and of the low value of the range.

For instance, the oxygen concentration range from "about 50,000 ppm to about 2000 ppm" is an oxygen concentration of 50,000 to 2000 ppm or is an oxygen concentration of substantially 50,000 to 2000 ppm. The oxygen concentration range from "about 50,000 ppm to about 2000 ppm" can represent, in some embodiments, an oxygen concentration of 50,000 ppm plus or minus (±) 10% to 2000 ppm plus or minus (±) 10%. In other embodiments, the oxygen concentration range from "about 50,000 ppm to about 2000 ppm" can represent an oxygen concentration of 50,000 ppm plus or minus (±) 5% to 2000 ppm plus or minus (±) 5%. In yet other embodiments, the oxygen concentration range from "about 50,000 ppm to about 2000 ppm" can represent an oxygen concentration of 50,000 ppm plus or minus (±) 2% to 2000 ppm plus or minus (±) 2%. An oxygen concentration range of about a high value of the range to about a low value of the range, e.g., 50,000 ppm to about 2000 ppm, takes into consideration the accuracy of the exposure equipment components and measurement devices, along with other factors, such as the particular photopolymer composition, that may influence the printing form resulting from the present method to have the desired dot shape, small or fine feature formation, and removal of unpolymerized material.

The photosensitive element of the present invention is exposed through the in-situ mask to actinic radiation from suitable sources. The actinic radiation exposure time can vary from a few seconds to minutes, depending upon the intensity and spectral energy distribution of the radiation, its distance from the photosensitive element, the desired image resolution, and the nature and amount of the photopolymerizable composition. Exposure temperatures are preferably ambient or slightly higher, i.e., about 20° C. to about 35° C. Exposure is of sufficient duration to crosslink the exposed areas down to the support or to the back exposed layer, i.e., floor. Imagewise exposure time is typically much longer than backflash exposure time, and ranges from a few to tens of minutes. Imagewise exposure sufficient to crosslink the exposed areas down to the support or the floor, can also be determined by providing energy density from the actinic radiation source of about 5000 to about 25000 milliJoules/cm$^2$ to the photosensitive element.

Actinic radiation sources encompass the ultraviolet and visible wavelength regions. The suitability of a particular actinic radiation source is governed by the photosensitivity of the initiator and the at least one monomer used in preparing the flexographic printing plates. The preferred photosensitivity of most common flexographic printing plates are in the UV and deep UV area of the spectrum, as they afford better room-light stability. Examples of suitable visible and UV sources include carbon arcs, mercury-vapor arcs, content fluorescent lamps, electron flash units, electron beam units, lasers, and photographic flood lamps. Examples of industry standard radiation sources include the Sylvania 350 Blacklight fluorescent lamp (FR48T12/350 VL/VHO/180, 115 w), and the Philips UV-A "TL"-series low-pressure mercury-vapor fluorescent lamps. In some embodiments, a mercury vapor arc or a sunlamp can be used. In other embodiments, a high-ultraviolet content fluorescent lamp can be used at a distance of about 1 to about 10 inches (about 2.54 to about 25.4 cm) from the photosensitive element. These radiation sources generally emit long-wave UV radiation between 310-400 nm.

In some embodiments, the method to make the relief printing form includes a back exposure or backflash step. This is a blanket exposure to actinic radiation through the support. It is used to create a layer of polymerized material, or a floor, on the support side of the photopolymerizable layer and to sensitize the photopolymerizable layer. The floor provides improved adhesion between the photopolymerizable layer and the support and establishes the depth of the plate relief. The backflash exposure can take place before, after or during the other imaging steps. Any of the conventional radiation sources discussed above for the overall (imagewise) actinic radiation exposure step can be used for the backflash exposure step. Exposure time generally range from a few seconds up to a few minutes. In some embodiments, a floor for may be included in the photosensitive element when the photosensitive element is produced, such that a separate backflash exposure may not be necessary.

Following overall exposure to UV radiation through the mask, the exposed photosensitive element is treated to remove unpolymerized areas in the photopolymerizable layer and thereby form the relief surface. The treating step removes at least the photopolymerizable layer in the areas which were not exposed to actinic radiation, i.e., the unexposed areas or uncured areas or unpolymerized portions, of the photopolymerizable layer. Except for the elastomeric capping layer, in most embodiments the additional layers that may be present on the photopolymerizable layer are removed or substantially removed from the polymerized areas of the photopolymerizable layer. In some embodiments of the photosensitive elements having an in-situ mask, the treating step also removes the mask image (which had been exposed to actinic radiation) and the underlying unexposed areas of the photopolymerizable layer.

Treating the element thermally includes heating the photosensitive element having at least one photopolymerizable layer (and the additional layer/s) to a temperature sufficient to cause the uncured portions of the photopolymerizable layer to liquefy, i.e., soften or melt or flow, and removing the unpolymerized portions or uncured portion/s. The layer of the photosensitive composition is capable of partially liquefying upon thermal development. That is, during thermal development the uncured composition must soften or melt or flow at a reasonable processing or developing temperature. If the photosensitive element includes one or more additional layers on the photopolymerizable layer, it is desirable (but not necessary) that the one or more additional layers are also removable in the range of acceptable developing temperatures for the photopolymerizable layer. The polymerized areas (cured portions) of the photopolymerizable layer have a higher melting temperature than the unpolymerized areas (uncured portions) and therefore do not melt, soften, or flow at the thermal development temperatures. The uncured portions can be removed from the cured portions of the composition layer by any means including air or liquid stream under pressure as described in U.S. publication 2004/0048199 A1, vacuum as described in Japanese publication 53-008655, and contacting with an absorbent material as described in U.S. Pat. No. 3,060,023; U.S. 3,264,103; U.S. 5,015,556; U.S. 5,175,072; U.S. 5,215,859; U.S. 5,279,697; and U.S. 6,797,454. A preferred method for removing the unpolymerized portions or uncured portions is by contacting an outermost surface of the element to an absorbent surface, such as a development medium, to absorb or wick away or blot the melt or soften portions. Thermal development may also be called dry development, since the photosensitive element need not contact a solution to washout or remove the unpolymerized portions, that is by so-called wet development. It is contemplated that a combination of wet and dry treatments can be used to prepare the photosensitive element into a printing form. For example, one or more layers, such as the mask, on the exposed photosensitive element could be removed by wet development, and then the photosensitive element undergoes thermal treatment to remove the unpolymerized portions of the photopolymerizable layer.

The term "melt" is used to describe the behavior of the un-irradiated (uncured) portions of the composition layer subjected to an elevated temperature that softens and reduces the viscosity to permit absorption by the absorbent material. However throughout this specification the terms "melting", "softening", and "liquefying" may be used to describe the behavior of the heated un-irradiated portions of the composition layer, regardless of whether the composition may or may not have a sharp transition temperature between a solid and a liquid state. A wide temperature range may be utilized to "melt" the composition layer for the purposes of this invention. Absorption may be slower at lower temperatures and faster at higher temperatures during successful operation of the process.

The thermal treating steps of heating the photosensitive element and contacting an outermost surface of the element with development medium can be done at the same time, or in sequence provided that the uncured portions of the photopolymerizable layer are still soft or in a melt state when contacted with the development medium. The at least one photopolymerizable layer (and the additional layer/s) are heated by conduction, convection, radiation, or other heating methods to a temperature sufficient to effect melting of the uncured portions but not so high as to effect distortion of the cured portions of the layer. The one or more additional layers disposed above the photopolymerizable layer may soften or melt or flow and be absorbed as well by the development medium. The photosensitive element is heated to a surface temperature above about 40° C., preferably from about 40° C. to about 230° C. (104-446° F.) in order to effect melting or flowing of the uncured portions of the photopolymerizable layer. By maintaining more or less intimate contact of the development medium with the photopolymerizable layer that is molten in the uncured regions, a transfer of the uncured photosensitive material from the photopolymerizable layer to the development medium takes place. While still in the heated condition, the development medium is separated from the cured photopolymerizable layer in contact with the support layer to reveal the relief structure. A cycle of the steps of heating the photopolymerizable layer and contacting the molten (portions) layer with the development medium can be repeated as many times as necessary to adequately remove the uncured material and create sufficient relief depth. However, it is desirable to minimize the number of cycles for suitable system performance, and typically the photopolymerizable element is thermally treated for 5 to 15 cycles. Intimate contact of the development medium to the photopolymerizable layer (while in the uncured portions are melt) may be maintained by the pressing the layer and the development medium together.

The development medium is selected to have a melt temperature exceeding the melt or softening or liquefying temperature of the unirradiated or uncured portions of the radiation curable composition and having good tear resistance at the same operating temperatures. The selected material withstands temperatures required to process the photosensitive element during heating. The development medium may also be referred to herein as development material, absorbent material, absorbent web, and web. The development medium should also possess absorbency for the molten elastomeric composition. The development medium is selected from non-woven materials, paper stocks, fibrous woven material, open-celled foam materials, porous materials that contain more or less a substantial fraction of their included volume as void volume. The development medium can be in web or sheet form. In some embodiments, the development medium is a non-woven web of nylon or a non-woven web of polyester.

After the treatment step, the photosensitive element can be uniformly post-exposed to ensure that the photopolymerization process is complete and that the so formed flexographic printing plate will remain stable during printing and storage. This post-exposure step can utilize the same radiation source as the imagewise main exposure. Furthermore, if the surface of the flexographic printing plate is still tacky, detackification treatments may be applied. Such methods, which are also called "finishing", are well known in the art. For example, tackiness can be eliminated by a treatment of the flexographic printing plate with bromine or chlorine solutions. Preferably, detackification is accomplished by exposure to UV radiation sources having a wavelength not longer than 300 nm. This so-called "light-finishing" is disclosed in European Published Patent Application 0 017927 and U.S. Pat. No. 4,806, 506. Various finishing methods may also be combined. Typically, the post-exposure and the finishing exposure are done at the same time on the photosensitive element using an exposure device that has both sources of radiation.

The present method prepares a relief printing form using a digital workflow that has been modified by imagewise exposing the photosensitive element through the in-situ mask to actinic radiation in an environment having an inert gas and an oxygen concentration of about 50,000 ppm to about 2000 ppm, and uses thermal treatment to remove unpolymerized material. The modified digital workflow in the preparation of relief printing forms provides the advantages of conventional digital workflow to create the in-situ mask, and also provides the capability to create fine, well-structured raised surface elements in which each raised element is finely conically-shaped and the top surface areas of the raised surface elements is flatter or substantially flat and not as rounded as is typical of raised elements prepared by conventional digital workflow, thereby avoiding the dot-sharpening effect that typically occurs with conventional digital image forming processes. The present method of modified digital workflow provides a shape to the raised surface elements that is similar to that formed with analog workflow. In particular, the shape of the raised surfaces produced by the present process differs from the shape of the raised surfaces produced by the conventional digital workflow process and to some extent from the traditional analog process. The present method of modified digital workflow provides the print form with fully or substantially fully defined or formed small or fine feature elements, i.e., features less than about 20 micron, to hold or maintain microcell patterning in solid areas, and thus the capability to print increased density of ink in the print solid areas. The present invention provides for the capability to create the relief image on the printing form that essentially is the recreation of the in-situ mask image, particularly in terms of size of openings in mask relative to the size of the raise element (i.e., halftone dot). Further, the present method that includes the step of thermally treating the imagewise exposed photosensitive element provides environmental and economic advantages, while accommodating quality concerns for good and sufficient cleanout removal of unpolymerized material from support areas of the raised printing features and from the recessed area/s of the element.

After treatment of the precursor, the resulting relief printing form has relief structure forming a pattern that includes one or more individual surface elements raised from the floor for printing, and at least one recessed area which is a non-printing area. The mask having a plurality of openings and the it imagewise exposure in an inert atmosphere having about 50,000 ppm to about 2000 ppm oxygen creates the fine individually-formed raised surface elements (in the printing area). Because the plurality of raised surface elements is individually formed, the printing area correspondingly also includes open portions (in which the photopolymerizable material was removed by treatment) that surround each individual raised surface element. Each of the raised surface elements of the plurality of individual raised surface elements has a top surface area that carries the imaging material, such as ink or coating material, which is printed onto the substrate. That is, the feature size or dot size of each of the plurality of raised surface elements is only slightly smaller than the mask openings used to form the raise elements. In some embodiments, the dot size of the plurality of raised surface elements is smaller than the corresponding mask openings by less than 4%. In other embodiments, the dot size of the plurality of raised surface elements is smaller than the corresponding mask openings by less than 2%. In most embodiments, each raised surface element prepared by the present method has a top surface, i.e., substantially flat surface area that transfers the imaging material, with a diameter between about 10 and about 90 micrometers.

The imaging material, such as an ink, that is printed on the substrate can be applied to the printing form, and in particular, to the plurality of raised surface elements by any means suitable. In most embodiments in relief printing, typically an anilox roller is used to meter the coating material onto the relief surface of the printing form. But the present method is not limited to the conventional method of application of the imaging material to the printing form.

Substrates suitable for printing by the present method are not limited and may have none, one, or more other layers or portions of layers present prior to the application of the imaging material. Examples of substrates include, but are not limited to, paper, paperboard, plastic, glass, polymeric films, etc.

Photosensitive Element

The photosensitive precursor element of the present invention used for preparing relief printing forms comprises at least one photopolymerizable layer. Relief printing forms encompass flexographic printing forms and letterpress printing forms. Relief printing is a method of printing in which the printing form prints from an image area, where the image area of the printing form is raised and the non-image area is depressed. Optionally, the photosensitive element includes a support. Optionally, the photosensitive element includes a layer of an actinic radiation opaque material adjacent the photopolymerizable layer. In one embodiment, the photosensitive element includes a layer of photopolymerizable composition composed at least of a binder, at least one ethylenically unsaturated compound, and a photoinitiator. In another embodiment, the layer of the photopolymerizable composition includes an elastomeric binder, at least one ethylenically unsaturated compound, and a photoinitiator. In some embodiments, the relief printing form is an elastomeric printing form (i.e., the photopolymerizable layer is an elastomeric layer) to accommodate the compression necessary for contact printing.

Unless otherwise indicated, the term "relief printing plate or element" encompasses plates or elements in any form suitable for flexographic printing and for letterpress printing. Unless otherwise indicated, the terms "photosensitive element" and "printing form" encompass elements or structures in any form suitable as precursors for printing, including, but not limited to, flat sheets, plates, seamless continuous forms, cylindrical forms, plates-on-sleeves, and plates-on-carriers.

The support can be any flexible material that is conventionally used with photosensitive elements used to prepare relief printing plates. In some embodiments the support is transparent to actinic radiation to accommodate "backflash" exposure through the support. Examples of suitable support materials include polymeric films such those formed by addition polymers and linear condensation polymers, transparent foams and fabrics. Under certain end-use conditions, metals such as aluminum, may also be used as a support, even though a metal support is not transparent to radiation. A preferred support is a polyester film; particularly preferred is polyethylene terephthalate. The support may be in sheet form or in cylindrical form, such as a sleeve. The sleeve may be formed from single layer or multiple layers of flexible material. Flexible sleeves made of polymeric films are preferred, as they typically are transparent to ultraviolet radiation and thereby accommodate backflash exposure for building a floor in the cylindrical printing element. A preferred sleeve is a multiple layered sleeve as disclosed in U.S. Pat. No. 5,301,610. The sleeve may also be made of non-transparent, actinic radiation blocking materials, such as nickel or glass epoxy. The support has a thickness typically from 0.002 to 0.250 inch (0.0051 to 0.635 cm). In some embodiments, the thickness for the sheet form is 0.003 to 0.016 inch (0.0076 to 0.040 cm). In some embodiments, the sleeve has a wall thickness from 4 to 80 mils (0.010 to 0.203 cm) or more.

Optionally, the element includes an adhesive layer between the support and the photopolymerizable layer, or a surface of the support that is adjacent the photopolymerizable layer has an adhesion promoting surface. The adhesive layer on the surface of the support can be a subbing layer of an adhesive material or primer or an anchor layer as disclosed in U.S. Pat. No. 2,760,863 and U.S. Pat. No. 3,036,913 to give suitable adhesion between the support and the photopolymerizable layer. Alternatively, the surface of the support on which the photopolymerizable layer resides can be treated to promote adhesion between the support and the photopolymerizable layer, with flame-treatment or electron-treatment, e.g., corona-treated.

The photosensitive element includes at least one layer of a photopolymerizable composition. As used herein, the term "photopolymerizable" is intended to encompass systems that are photopolymerizable, photocrosslinkable, or both. The photopolymerizable layer is a solid layer formed of the composition comprising a binder, at least one ethylenically unsaturated compound, and a photoinitiator. The photoinitiator has sensitivity to actinic radiation. Throughout this specification actinic light will include ultraviolet radiation and/or visible light. The solid layer of the photopolymerizable composition is treated with one or more solutions and/or heat to form a relief suitable for relief printing. As used herein, the term "solid" refers to the physical state of the layer which has a definite volume and shape and resists forces that tend to alter its volume or shape. A solid layer of the photopolymerizable composition may be polymerized (photohardened), or unpolymerized, or both. In some embodiments, the layer of the photopolymerizable composition is elastomeric.

The binder can be a single polymer or mixture of polymers. In some embodiments, the binder is an elastomeric binder. In other embodiments, the layer of the photopolymerizable composition is elastomeric. Binders include natural or synthetic polymers of conjugated diolefin hydrocarbons, including polyisoprene, 1,2-polybutadiene, 1,4-polybutadiene, butadiene/acrylonitrile, and diene/styrene thermoplastic-elastomeric block copolymers. Preferably, the elastomeric block copolymer of an A-B-A type block copolymer, where A represents a non-elastomeric block, preferably a vinyl polymer and most preferably polystyrene, and B represents an elastomeric block, preferably polybutadiene or polyisoprene. In some embodiments, the elastomeric A-B-A block copolymer binders can be polystyrene/isoprene/styrene) block copolymers, polystyrene/butadiene/styrene) block copolymers, and combinations thereof. The binder is present in an amount of about 10% to 90% by weight of the photosensitive composition. In some embodiments, the binder is present at about 40% to 85% by weight of the photosensitive composition.

Other suitable binders include acrylics; polyvinyl alcohol; polyvinyl cinnamate; polyamides; epoxies; polyimides; styrenic block copolymers; nitrile rubbers; nitrile elastomers; non-crosslinked polybutadiene; non-crosslinked polyisoprene; polyisobutylene and other butyl elastomers; polyalkyleneoxides; polyphosphazenes; elastomeric polymers and copolymers of acrylates and methacrylate; elastomeric polyurethanes and polyesters; elastomeric polymers and copolymers of olefins such as ethylene-propylene copolymers and non-crosslinked EPDM; elastomeric copolymers of vinyl acetate and its partially hydrogenated derivatives.

The photopolymerizable composition contains at least one compound capable of addition polymerization that is compatible with the binder to the extent that a clear, non-cloudy photosensitive layer is produced. The at least one compound capable of addition polymerization may also be referred to as a monomer and can be a single monomer or mixture of monomers. Monomers that can be used in the photopolymerizable composition are well known in the art and include, but are not limited to, addition-polymerization ethylenically unsaturated compounds with at least one terminal ethylenic group. Monomers can be appropriately selected by one skilled in the art to provide elastomeric property to the photopolymerizable composition.

The at least one compound capable of addition polymerization (i.e., monomer) is present in at least an amount of 5%, typically 10 to 20%, by weight of the photopolymerizable composition.

The photoinitiator can be any single compound or combination of compounds which is sensitive to actinic radiation, generating free radicals which initiate the polymerization of the monomer or monomers without excessive termination. Any of the known classes of photoinitiators, particularly free radical photoinitiators may be used. Alternatively, the photoinitiator may be a mixture of compounds in which one of the compounds provides the free radicals when caused to do so by a sensitizer activated by radiation. In most embodiments, the photoinitiator for the main exposure (as well as post-exposure and backflash) is sensitive to visible or ultraviolet radiation, between 310 to 400 nm, and preferably 345 to 365 nm. Photoinitiators are generally present in amounts from 0.001% to 10.0% based on the weight of the photopolymerizable composition.

The photopolymerizable composition can contain other additives depending on the final properties desired. Additional additives to the photopolymerizable composition include sensitizers, plasticizers, rheology modifiers, thermal polymerization inhibitors, colorants, processing aids, antioxidants, antiozonants, dyes, and fillers.

The thickness of the photopolymerizable layer can vary over a wide range depending upon the type of printing plate desired, for example, from about 0.005 inches to about 0.250 inches or greater (about 0.013 cm to about 0.64 cm or greater). In some embodiments, the photopolymerizable layer has a thickness from about 0.005 inch to 0.0450 inch (0.013 cm to 0.114 cm). In some other embodiments, the photopolymerization layer has a thickness from about 0.020 inches to about 0.112 inches (about 0.05 cm to about 0.28 cm). In other embodiments, the photopolymerizable layer has a thickness from about 0.112 inches to about 0.250 inches or greater (0.28 cm to about 0.64 cm or greater).

It is well within the skill of the practitioner in the art to prepare a photosensitive precursor element that includes a layer of the photopolymerizable composition formed by admixing the binder, monomer, initiator, and other ingredients. In most embodiments, the photopolymerizable mixture is formed into a hot melt and, then optionally extruded, calendered to the desired thickness and planar or cylindrical shape. The photosensitive element includes at least one photopolymerizable layer that can be of a bi- or multi-layer construction. Further, the photosensitive element may include an elastomeric capping layer on the at least one photopolymerizable layer. Multilayer cover elements and compositions suitable as the elastomeric capping layer are disclosed in Gruetzmacher et al., U.S. Pat. No. 4,427,759 and U.S. 4,460,675.

The photosensitive element can include the actinic radiation opaque layer disposed above a surface of the photopolymerizable layer opposite the support, or can form an assemblage with separate carrier or element that includes the actinic radiation opaque layer. With the exception of traditional silver-halide based materials forming phototools, materials constituting the actinic radiation opaque layer and structures incorporating the actinic radiation opaque layer are not particularly limited, provided that the radiation opaque layer can be imagewise exposed to form the in-situ mask on or adjacent the photopolymerizable layer of the photosensitive element. The actinic radiation opaque layer may substantially cover the surface or only cover an imagable portion of the photopolymerizable layer. The actinic radiation opaque layer is substantially opaque to actinic radiation that corresponds with the sensitivity of the photopolymerizable material. The actinic radiation opaque layer can be used with or without a barrier layer. If used with the barrier layer, the barrier layer is disposed between the photopolymerizable layer and the radiation opaque layer to minimize migration of materials between the photopolymerizable layer and the radiation opaque layer. Monomers and plasticizers can migrate over time if they are compatible with the materials in an adjacent layer, which can alter the laser radiation sensitivity of the radiation opaque layer or can cause smearing and tackifying of the radiation opaque layer after imaging. The actinic radiation opaque layer is also sensitive to laser radiation that can selectively remove or transfer the opaque layer.

In one embodiment, the actinic radiation opaque layer is sensitive to infrared laser radiation. In some embodiments, the actinic radiation opaque layer comprises a radiation-opaque material, an infrared-absorbing material, and an optional binder. Dark inorganic pigments, such as carbon black and graphite, mixtures of pigments, metals, and metal alloys generally function as both infrared-sensitive material and radiation-opaque material. The optional binder is a polymeric material which includes, but is not limited to, self-oxidizing polymers, non-self-oxidizing polymers, thermochemically decomposable polymers, polymers and copolymers of butadiene and isoprene with styrene and/or olefins, pyrolyzable polymers, amphoteric interpolymers, polyethylene wax, materials conventionally used as the release layer described above, and combinations thereof. The thickness of the actinic radiation opaque layer should be in a range to optimize both sensitivity and opacity, which is generally from about 20 Angstroms to about 50 micrometers. The actinic radiation opaque layer should have a transmission optical density of greater than 2.0 in order to effectively block actinic radiation and the polymerization of the underlying photopolymerizable layer.

The photosensitive element may include the actinic radiation opaque layer disposed above and covers or substantially covers the entire surface of the photopolymerizable layer. In this case the infrared laser radiation imagewise removes, i.e., ablates or vaporizes, the radiation opaque layer to form the in-situ mask. Suitable materials and structures for this actinic radiation opaque layer are disclosed by Fan in U.S. Pat. No. 5,262,275; Fan in U.S. Pat. No. 5,719,009; Fan in U.S. Pat. No. 6,558,876; Fan in EP 0 741 330 A1; and Van Zoeren in U.S. Pat. Nos. 5,506,086 and 5,705,310. A material capture sheet adjacent the radiation opaque layer may be present during laser exposure to capture the material as it is removed from the photosensitive element as disclosed by Van Zoeren in U.S. Pat. No. 5,705,310. Only the portions of the radiation opaque layer that were not removed from the photosensitive element will remain on the element forming the in-situ mask.

In another embodiment, the photosensitive element will not initially include the actinic radiation opaque layer. A separate element bearing the radiation opaque layer will form an assemblage with the photosensitive element such that the radiation opaque layer is adjacent the surface of the photosensitive element opposite the support, which is typically is the photopolymerizable layer. (If present, a coversheet associated with the photosensitive element typically is removed prior to forming the assemblage.) The separate element may include one or more other layers, such as ejection layers or heating layers, to aid in the digital exposure process. Hereto, the radiation opaque layer is also sensitive to infrared radiation. The assemblage is exposed imagewise with infrared laser radiation to selectively transfer or selectively alter the adhesion balance of the radiation opaque layer and form the image on or disposed above the photopolymerizable layer. Materials and structures suitable for this actinic radiation opaque layer are disclosed by Fan et al. in U.S. Pat. No. 5,607,814; and Blanchett in U.S. Pat. Nos. 5,766,819; 5,840,463; and EP 0 891 877 A. As a result of the imagewise transfer process, only the transferred portions of the radiation opaque layer will reside on the photosensitive element forming the in-situ mask.

The photosensitive printing element of the present invention may further include a temporary coversheet on top of the uppermost layer of the element. One purpose of the coversheet is to protect the uppermost layer of the photosensitive printing element during storage and handling. Examples of suitable materials for the coversheet include thin films of polystyrene, polyethylene, polypropylene, polycarbonate, fluoropolymers, polyamide or polyesters, which can be subbed with release layers.

GLOSSARY

"Lines per inch" (LPI) is a measurement of printing resolution in systems which use a halftone screen. It is a measure of how close together lines in a halftone grid are. Higher LPI generally indicates greater detail and sharpness to an image.

"Halftone" is used for the reproduction of continuous-tone images, by a screening process that converts the image into dots of various sizes and equal spacing between centers. A halftone screen enables the creation of shaded (or grey) areas in images that are printed by transferring (or non-transferring) of a printing medium, such as ink.

"Dots per inch" (DPI) is a frequency of dot structures in a tonal image, and is a measure of spatial printing dot density, and in particular the number of individual dots that can be placed within the span of one linear inch (2.54 cm). The DPI value tends to correlate with image resolution. Typical DPI range for graphics applications: 75 to 150, but can be as high as 200.

"Line screen resolution", which may sometimes be referred to as "screen ruling" is the number of lines or dots per inch on a halftone screen.

"Pixel width" is the inverse of the DPI value.

"Mask opening" is the "clear" area of an integral mask to allow exposure to actinic radiation of the underlying photopolymerizable material. (In some embodiments, the clear area is created by removal of actinic radiation opaque material from the element. In other embodiments, the clear area is created non-transfer of actinic radiation opaque material to the element.) Mask opening is measured with a measuring microscope. The effective mask opening area is calculated by measuring the area of the opening and dividing by the total pixel area defined by the screen resolution in lines per inch (LPI). The total pixel area is calculated using the equation $(1/LPI)^2$ and the effective mask opening is defined as the (opening area)/$(1/LPI)^2$. The mask opening is typically expressed as a percentage (of total pixel area).

"Phototool opening" is the area of the phototool that is transparent to actinic radiation expressed as a percentage of the total pixel area and is calculated similar to the above mask opening area.

"Optical Density" or simply "Density" is the degree of darkness (light absorption or opacity) of an image, and can be determined from the following relationship:

$$\text{Density} = \log_{10}\{1/\text{reflectance}\} \text{ where}$$

reflectance is {intensity of reflected light/intensity of incident light}

"Dot size on plate" is a measure of the diameter of the dot commonly assessed using a calibrated microscope or specialized optical apparatus. The measurement typically represents accurately the flat portion of the dot structure on the plate.

"Dot area on plate" or "plate dot area" is commonly expressed as a percentage and is generally calculated by converting the dot size to an area (area=$\pi r^2$) and dividing by the total pixel area as defined by the screen resolution.

"Effective Printed Dot Area" is a calculated quantity based on the density measurements of region printed with a regular array of dots of uniform size called a tint area and density measurements of a printed region with complete ink coverage (also referred to as 100% coverage or solid coverage). The equation used is called the Murray Davies equation and is represented below:

$$\text{Effective printed dot area} = (1-10^{-Dt})/(1-10^{-Ds})$$

where Dt=tint density and Ds=solid density

"Effective printing area (dot area) under pressure" is the dot area on the plate expressed as a percent of the total area that will come in contact with the substrate to be printed when the plate and substrate are in intimate contact with each other and when the plate/substrate exert pressure on each other.

"Plate to Print Dot Gain" represents the growth in the printed dot area from the dot area on plate expressed as a percentage of the total pixel area, to the effective printed dot area expressed as a percentage of coverage area. This is simply the difference between the two.

EXAMPLES

In the following examples, all percentages are by weight unless otherwise noted. CYREL® photopolymerizable printing plates, CYREL® Digital Imager, CYREL® exposure unit, and CYREL® processor, are all available from The DuPont Company (Wilmington, Del.).

Instrumentation

Common imaging techniques, such as a microscope or optical devices, may be used to determine the observed dot area of the printing plate, and the print samples. One example of a suitable optical device is a Betaflex flexo analyzer unit, from Beta Industries (Carlstadt, N.J.), which captures the raised structure of a relief printing form as an image for measurement and analysis of relief characteristics such as dot area, screen ruling, and dot quality.

A measuring microscope (Nikon Measurescope, model MM-11 from NIKON (USA) (Melville, N.Y.)) was used to capture images of the features on the plates.

A Hirox 3D Digital Microscope was used to measure dot shape and size, and depth of the recessed areas, and other features as indicated in the raised areas of a plate.

Examples 1 and 2

For Example 1 and Control A, several relief printing plates were prepared as follows each from a photosensitive element of a CYREL® photopolymer printing element, type DFH (67 mils, which is about the total thickness of the photopolymerizable layer and a support). The CYREL® DFH photopolymer printing element, which may be referred to as 67DFH, includes a layer of a photopolymerizable composition that is composed of an elastomeric binder, an ethylenically unsaturated compound, a photoinitiator, and conventional additives, adjacent a support, and an infrared radiation sensitive laser ablatable layer disposed above a side of the photopolymerizable layer opposite the support. CYREL® 67DFH photopolymer printing element has a durometer of 70 Shore A, after processing.

For Example 2, several relief printing plates were prepared as follows each from a photosensitive element of a CYREL® photopolymer printing element, type DFQ (67 mils, which is about the total thickness of the photopolymerizable layer and a support). The CYREL® DFQ photopolymer printing element, which may be referred to as 67DFQ, includes a layer of a photopolymerizable composition that is composed of an elastomeric binder, an ethylenically unsaturated compound, a photoinitiator, and conventional additives, adjacent a support, and an infrared radiation sensitive laser ablatable layer disposed above a side of the photopolymerizable layer opposite the support. CYREL® 67DFQ photopolymer printing element has a durometer of 73 Shore A, after processing.

All photosensitive elements of Examples 1 and 2 and Control A were exposed on a CYREL® Digital Imager Spark at 3750 milliJoules/cm$^2$ having infrared laser radiation to imagewise ablate the infrared radiation sensitive layer from the print element, and form an in-situ mask on the photosensitive element. The in-situ mask image created for the imagewise exposure was the same for all elements of Examples 1, 2 and the Control A, and included line work (that is, text, symbols, and graphical elements) and halftone dot areas (that is, approximately 1 inch square portions of images) having 1 pixel openings at various line screens (e.g., 120, 133, 150, 171 lines per inch (lpi)). For each exposure condition, e.g., $N_2$ with 1% $O_2$ (inert gas of nitrogen and concentration of oxygen of 1%), one plate contained all the image features described above.

All the photosensitive elements having the in-situ mask of Examples 1, 2, and Control A were exposed on a CYREL® exposure unit to ultraviolet radiation at 365 nm for a blanket exposure through the support for approximately 60 seconds to form a floor, and then were main exposed at 365 nm at the desired environment conditions indicated below through the in-situ mask. All the photosensitive elements were oriented so that the in-situ mask was face-up on the exposure bed, and facing open space of an exposure chamber. The CYREL® Exposure unit was modified to include an exposure chamber as described in US Patent Publication US 2009/0191483 for overall exposure of the photosensitive element through the in-situ mask (i.e. imagewise exposure of the photopolymerizable layer) to ultraviolet radiation in an environment at the conditions described below. The exposure chamber resided on a bed of the exposure unit such that the glass of the bed formed one side of the exposure chamber, and was sufficiently sized to accommodate the planar-shaped photosensitive printing element. The source of ultraviolet radiation was located external to the chamber. The exposure chamber included a top side (i.e., a roof) and wall sides attached to the perimeter of the top side, all of which were transparent or substantially transparent to the actinic radiation, e.g., ultraviolet radiation, for the radiation to transmit through to the photosensitive element without appreciable scattering or absorbance. The walls were of a height sufficient to create an open space in the chamber above the photosensitive element so that a blanket of an environment of the inert gas and controlled oxygen concentration was created adjacent the in-situ mask of the photosensitive element. The exposure chamber included inlet port/s for introducing an inert gas, which was nitrogen, and optionally oxygen into the chamber. The exposure chamber included outlet port/s for purging air and other gases from the chamber so that the environment inside the chamber can be controlled at the desired conditions. The exposure chamber also included at least one oxygen meter for determining the concentration of the oxygen within the exposure chamber. More than one meter may have been used in order to monitor the concentration of oxygen over a broad range of possible oxygen concentrations in the exposure chamber, since an oxygen meter may be capable of measuring only a portion of the possible range of oxygen concentrations. The oxygen concentration meter/s were located at the outlet port and measurement of the oxygen concentration at the outlet was representative of the concentration of oxygen in the internal environment of the exposure chamber. Each photosensitive element with the in-situ mask of Examples 1, 2, and Control A were placed face up on the exposure bed and the exposure chamber was closed. Then, prior to main exposure, a precise mixture of both nitrogen as the inert gas and oxygen was introduced into the chamber. Main exposure was started when the internal environment of the exposure chamber reached the desired condition, and continued for the time indicated while the desired condition was maintained by the continued introduction of both nitrogen as the inert gas and oxygen in to the chamber. For Examples 1, 2, and Control A the main exposure was 22 minutes at about 15 milliJoules/cm$^2$.

For Examples 1 and 2, the photosensitive elements (with mask) were main exposed at three different environment conditions in the exposure chamber, in which the concentration of oxygen was at 0.1% (1000 ppm), 0.5% (5000 ppm), and 1% (10,000 ppm), and the inert gas was nitrogen. For Control A, the photosensitive elements (with mask) were main exposed in an environment in the exposure chamber which was substantially pure nitrogen, that is, the concentration of oxygen in the exposure chamber was less than 0.01%.

The photosensitive elements were processed in a CYREL® FAST TD1000 thermal development apparatus at the standard conditions recommended for developing 67 mil thick plates, to form a relief surface suitable for flexographic printing. Infrared lamps were used to aid in heating the photosensitive element. A pass of the printing element in the thermal processor constituted heating the element, contacting the element with a web of a nonwoven development medium to remove unpolymerized portions, and separating the development medium from the element.

Relief areas, which included raised elements of text and screen elements, were formed in the resulting printing plates. The resulting printing plates were evaluated for presence of dots in the screen areas, and for the removal of unpolymerized material in the recessed areas of the text and the line work.

The presence of dots was evaluated by assigning a relative percentage of fully formed dots to each microscope image as follows in Table 1.

TABLE 1

| Element | Test | Environment: Nitrogen and | Resolution 120 lpi | Resolution 133 lpi | Resolution 150 lpi | Resolution 171 lpi |
|---|---|---|---|---|---|---|
| Example 1 | DFH | A | 1% oxygen | 10% | 25% | 75% | 99% |
| Example 1 | DFH | B | 0.5% oxygen | 75% | 99% | 99% | 99% |
| Example 1 | DFH | C | 0.1% oxygen | 75% | 99% | 99% | — |
| Control A | DFH | | <<0.01% oxygen | 75% | 99% | 99% | 99% |
| Example 2 | DFQ | A | 1% oxygen | — | 10% | 50% | 99% |
| Example 2 | DFQ | B | 0.5% oxygen | — | 25% | 75% | 99% |
| Example 2 | DFQ | C | 0.1% oxygen | 25% | 75% | 99% | — |

The effect of the exposure environment is evident in the test series results, with a higher percentage of formed dots resulted from a lower percentage of oxygen during imagewise exposure to actinic radiation. The effect was also clearly observed in both plate types.

The adequacy of removal of the unpolymerized material was evaluated through analyzing the microscope images to obtain the maximum depth along the measurement vector that crosses the text elements. The results are shown in Table 2.

TABLE 2

| Element | Test | Environment: Nitrogen and | Max. Depth Text: "4" | Max. Depth Text: "8" |
|---|---|---|---|---|
| Example 1 | DFH | A | 1% oxygen | 87 um | 122 um |
| Example 1 | DFH | B | 0.5% oxygen | 65 um | 90 um |
| Example 1 | DFH | C | 0.1% oxygen | 42 um | 58 um |
| Control A | DFH |   | <0.01% oxygen | 15 um | 28 um |
| Example 2 | DFQ | A | 1% oxygen | 99 um | 130 um |
| Example 2 | DFQ | B | 0.5% oxygen | 79 um | 111 um |
| Example 2 | DFQ | C | 0.1% oxygen | 60 um | 55 um |

The effect of the exposure environment is evident in the results, with a higher degree of removal of unpolymerized material resulted from a higher percentage of oxygen during imagewise exposure to actinic radiation. This effect was also clearly observed in both plate types. Since clean out performance (i.e., maximum depth of text elements) improved for printing forms prepared by exposing in an environment with an inert gas and oxygen concentration of 0.2% or more and thermally developed compared to clean out of printing forms prepared by exposing in an environment with an inert gas and 0.1% oxygen concentration, this established the lower end of the oxygen concentration at 0.2% for the environment during exposing according to the present method.

Figure 2A:
FIG. 2Aa through FIG. 2Ac are reproductions of photographs taken of a print sample containing text and line work on a substrate that was printed by portions of a printing plate (67DFH) that corresponded to an image having a specific line screen resolution provided by an in-situ mask, wherein the printing plate was prepared by imagewise exposing a photosensitive element in an environment containing nitrogen and 1% oxygen concentration, and thermally treating as described in Example 1.
Figure 2A:
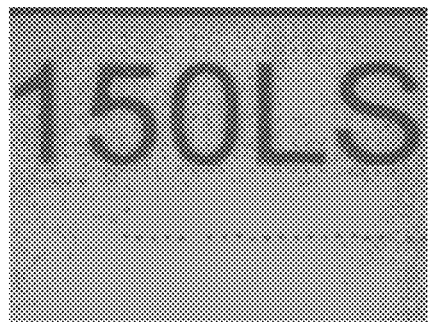
Figure 2A:
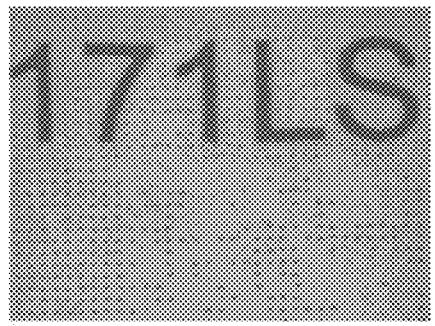

Some of the plates prepared above were printed onto a paper (web) substrate using a Mark Andy label press, at the standard printing conditions as practiced by experienced, skilled press operators. The printed images were evaluated for print quality, and substantiated that the observations and ratings of the microscopic images were reproduced on the printed images. That is, examples that were rated with a higher percentage of dots formed resulted in a higher percentage of dots printed on the substrate, and a larger depth in the text features resulted in an improvement in definition and appearance of the printed text elements on the substrate. Reproductions of photographs of portions of the text that printed on the substrate are shown in FIG. 2Aa through FIG. 2Ac, FIG. 2Ba through FIG. 2Bd, FIG. 10Aa, FIG. 10Ab, FIG. 10Ba, and FIG. 10Bb.

Figure 1B:
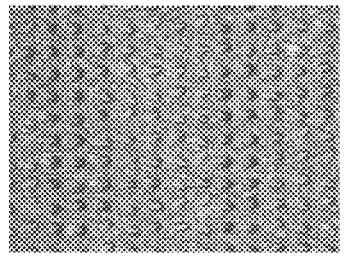
FIG. 1Ba is a reproduction of a photograph taken of a portion of a second printing plate at a line screen resolution of 120 lines per inch (lpi) as described above, wherein the second plate was prepared by exposing in the environment containing nitrogen and 0.5% concentration of oxygen, and thermally treating.
Figure 1B:
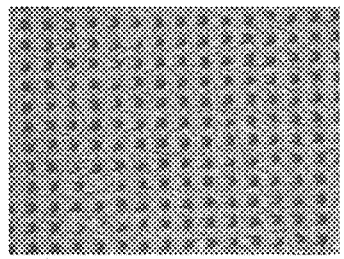
Figure 1B:
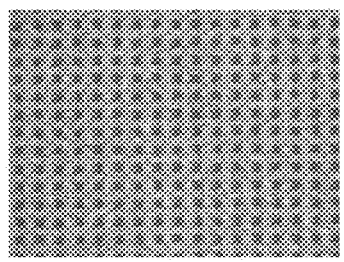
Figure 1B:
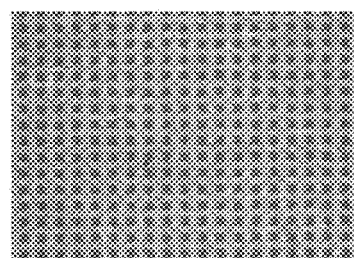
Figure 1C:
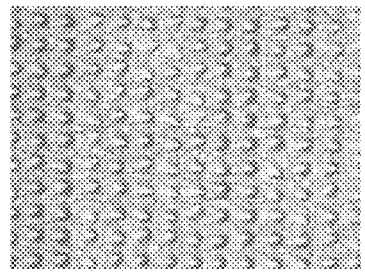
FIG. 1Ca is a reproduction of a photograph taken of a portion of a third printing plate at a line screen resolution of 120 lines per inch (lpi) as described above, wherein the third plate was prepared by exposing in the environment containing nitrogen and 0.1% concentration of oxygen, and thermally treating.
Figure 1C:
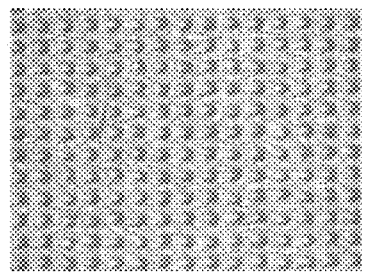
Figure 1C:
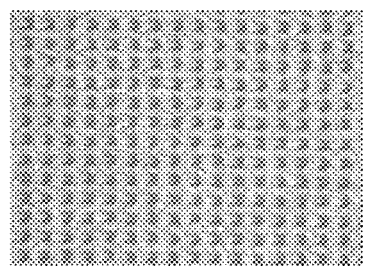
Figure 2B:
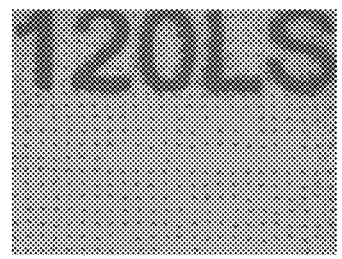
FIG. 2Ba through FIG. 2Bd are reproductions of photographs taken of a print sample containing text and line work on a substrate that was printed by portions of a printing plate (67DFH) that corresponded to an image having a specific line screen resolution provided by an in-situ mask, wherein the printing plate was prepared by imagewise exposing a photosensitive element in an environment of an inert gas and having less than 0.01% oxygen such that the environment was considered to contain substantially only nitrogen, and thermally treating as described for Control A in Example 1.
Figure 2B:
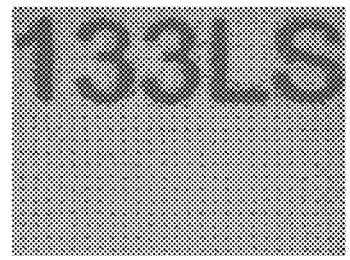
Figure 2B:
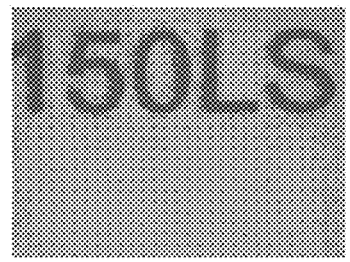
Figure 2B:
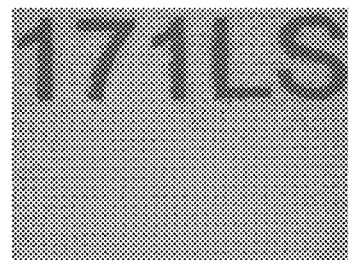
Figure 2B:
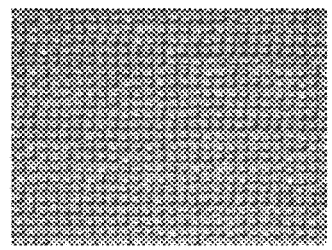
Figure 2B:
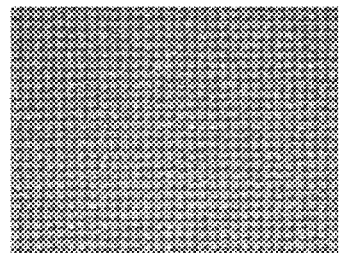
Figure 2B:
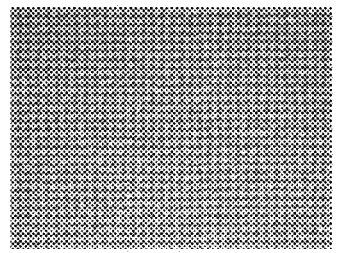
Figure 2B:
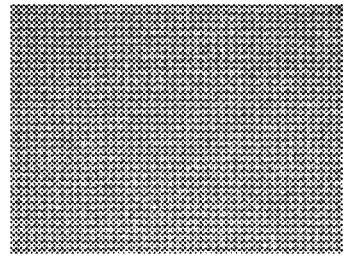
Figure 3A:
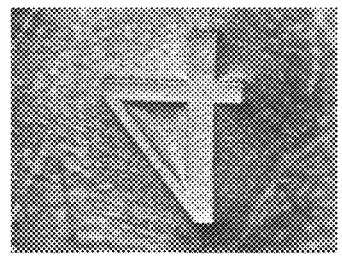
FIG. 3Aa through FIG. 3Ad, FIG. 3Ba through FIG. 3Bd, and FIG. 3Ca through FIG. 3Cd are reproductions of photographs taken of various text characters created in relief on a printing plate (67DFH), wherein each of three printing plates were prepared from each of three photosensitive elements by imagewise exposing each element in a specific environment containing an inert gas and concentration of oxygen as indicated, and thermally developing as described in Example 1.
Figure 3A:
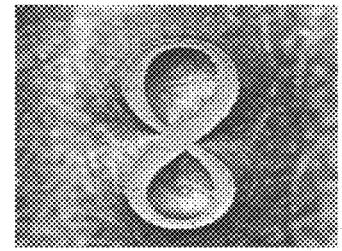
Figure 3A:
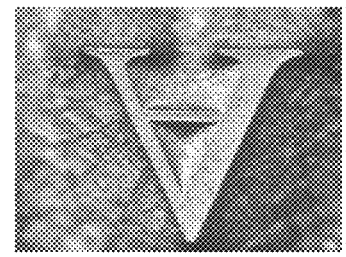
Figure 3A:
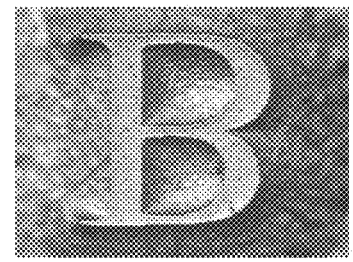
Figure 3B:
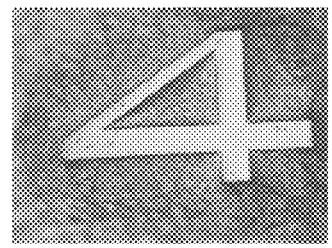
FIG. 3Ba is a reproduction of a photograph taken of a text character "4" from a second printing plate as described above, wherein the second plate was prepared by exposing in the environment containing nitrogen and 0.5% concentration of oxygen, and thermally treating.
Figure 3B:
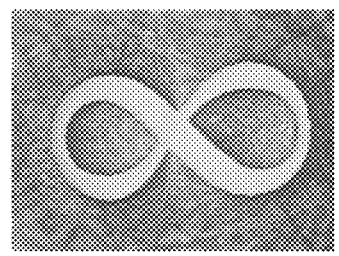
Figure 3B:
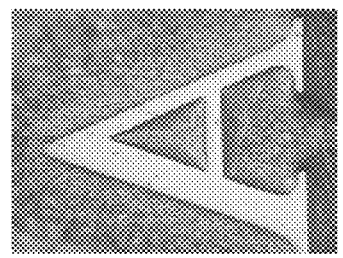
Figure 3B:
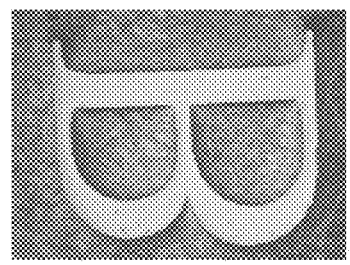
Figure 3C:
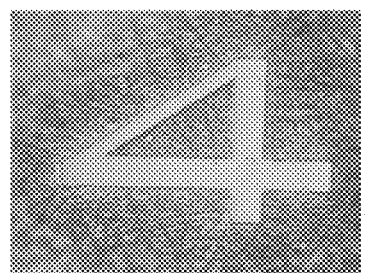
FIG. 3Ca is a reproduction of a photograph taken of a text character "4" from a third printing plate as described above, wherein the third plate was prepared by exposing in the environment containing nitrogen and 0.1% concentration of oxygen, and thermally treating.
Figure 3C:
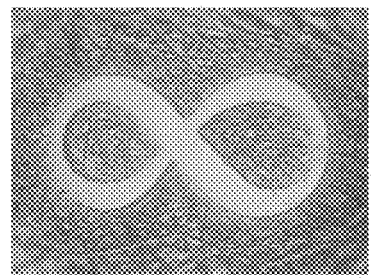
Figure 3C:
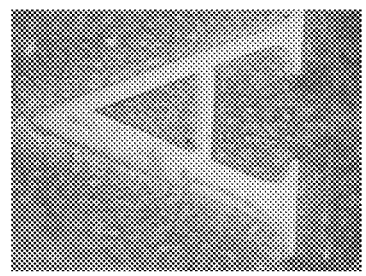
Figure 3C:
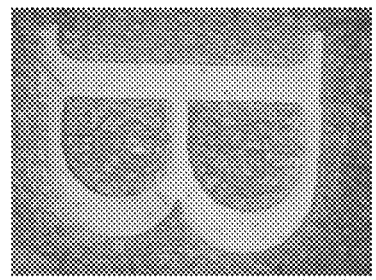
Figure 4A:
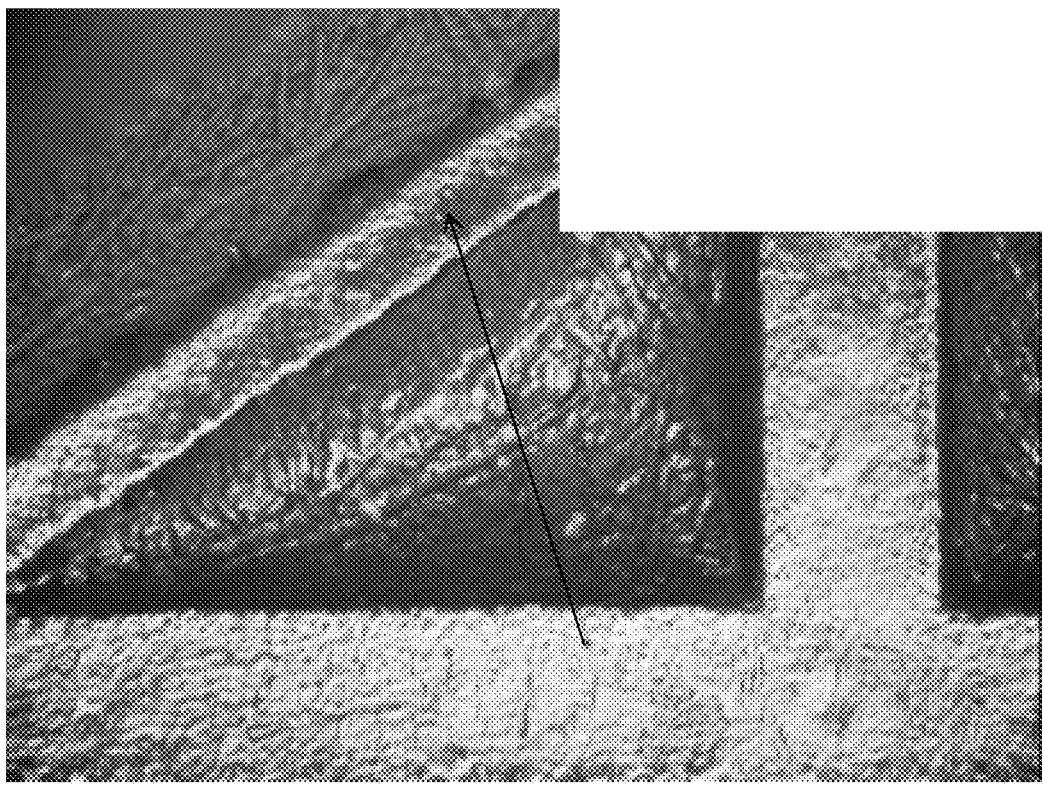
FIG. 4Aa is a reproduction of a close-up photograph taken of a text character created as a raised element on a first printing plate (67DFH) that was prepared by imagewise exposing in an environment containing an inert gas of nitrogen and 1% concentration of oxygen and thermally developing as described in Example 1. The photograph includes an arrow as a measurement vector that indicates location along which the text character was measured.
Figure 4A:
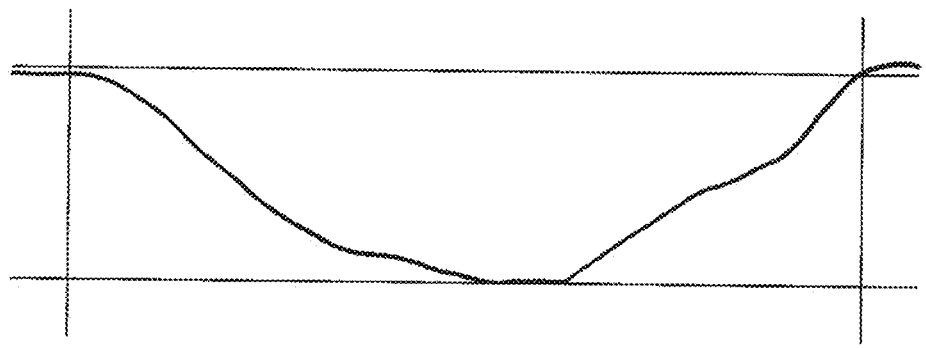
Figure 4B:
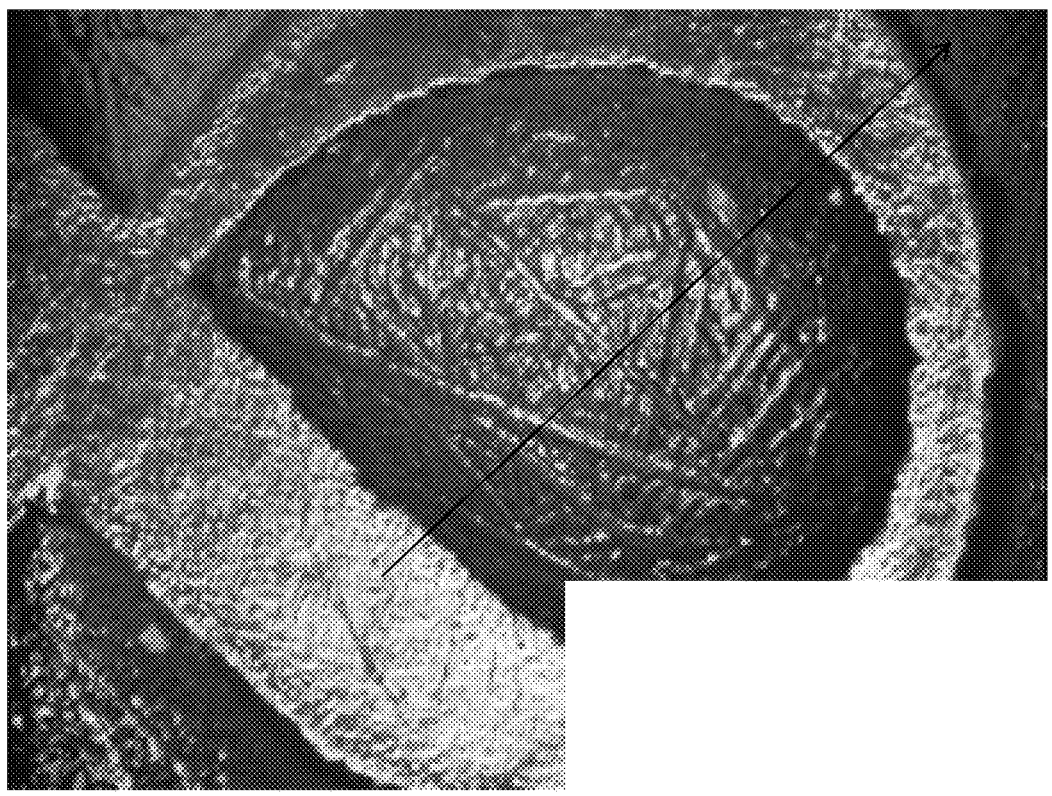
FIG. 4Ba is a reproduction of a close-up photograph taken of a second text character created as a raised element on a first printing plate (67DFH) that was prepared by imagewise exposing in an environment containing an inert gas of nitrogen and 1% concentration of oxygen and thermally developing as described in Example 1. The photograph includes an arrow as a measurement vector that indicates location along which the second text character was measured.
Figure 4B:
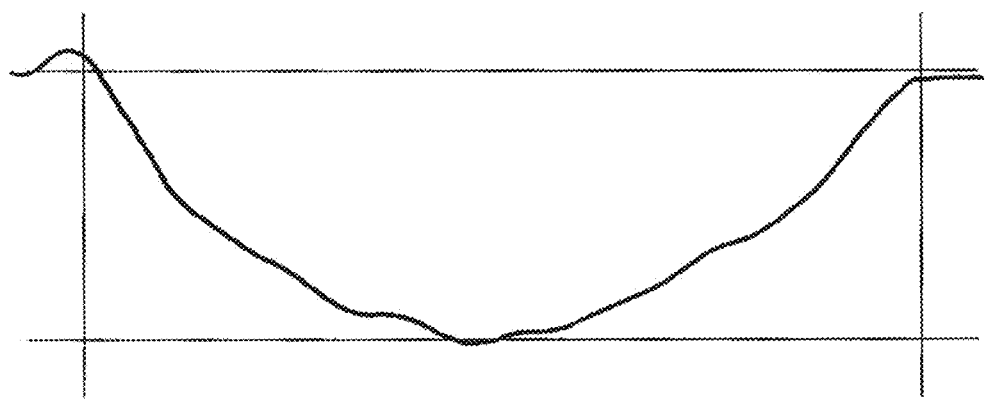
Figure 4C:
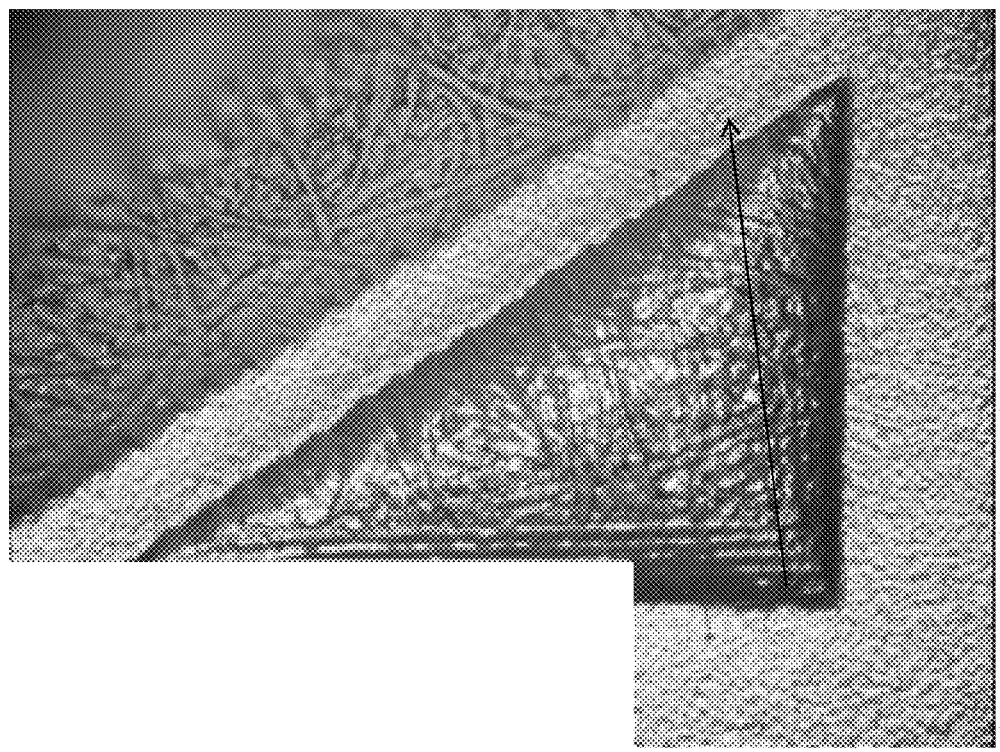
FIG. 4Ca is a reproduction of a close-up photograph taken of a text character created as a raised element on another printing plate (67DFH) that was prepared by imagewise exposing in an environment containing an inert gas of nitrogen and 0.5% concentration of oxygen and thermally developing as described in Example 1. The photograph includes an arrow as a measurement vector that indicates location along which the text character was measured.
Figure 4C:
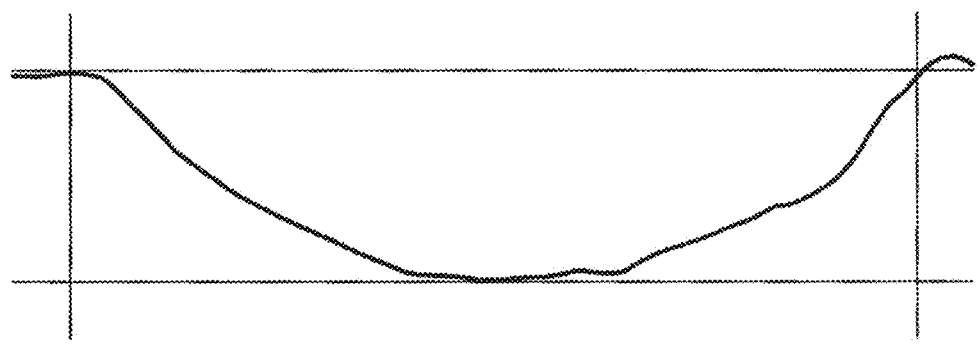
Figure 4D:
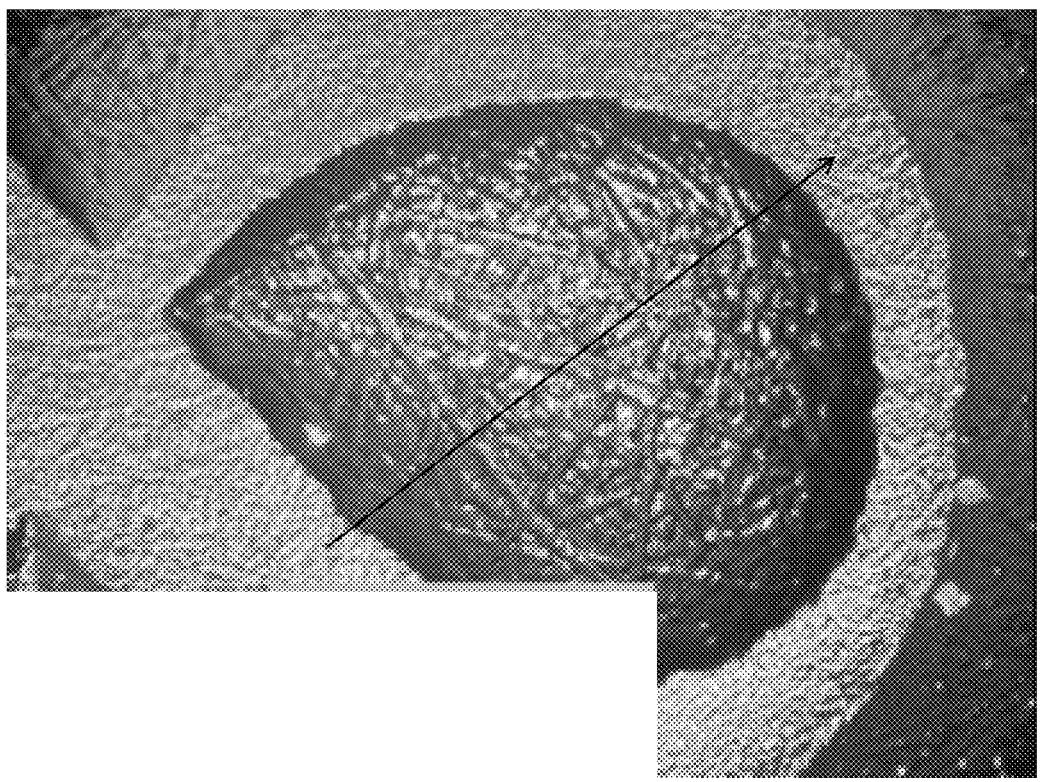
FIG. 4Da is a reproduction of a close-up photograph taken of a text character created as a raised element on another printing plate (67DFH) that was prepared by imagewise exposing in an environment containing an inert gas of nitrogen and 0.5% concentration of oxygen and thermally developing as described in Example 1. The photograph includes an arrow as a measurement vector that indicates location along which the text character was measured.
Figure 4D:
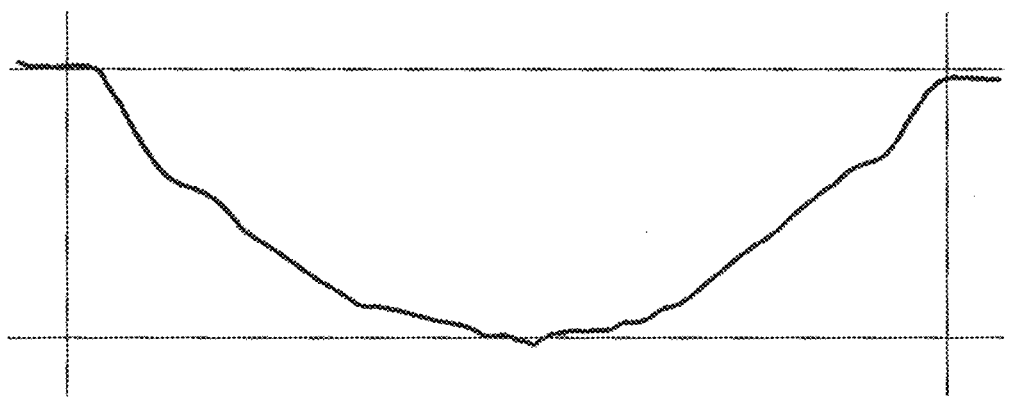
Figure 5A:
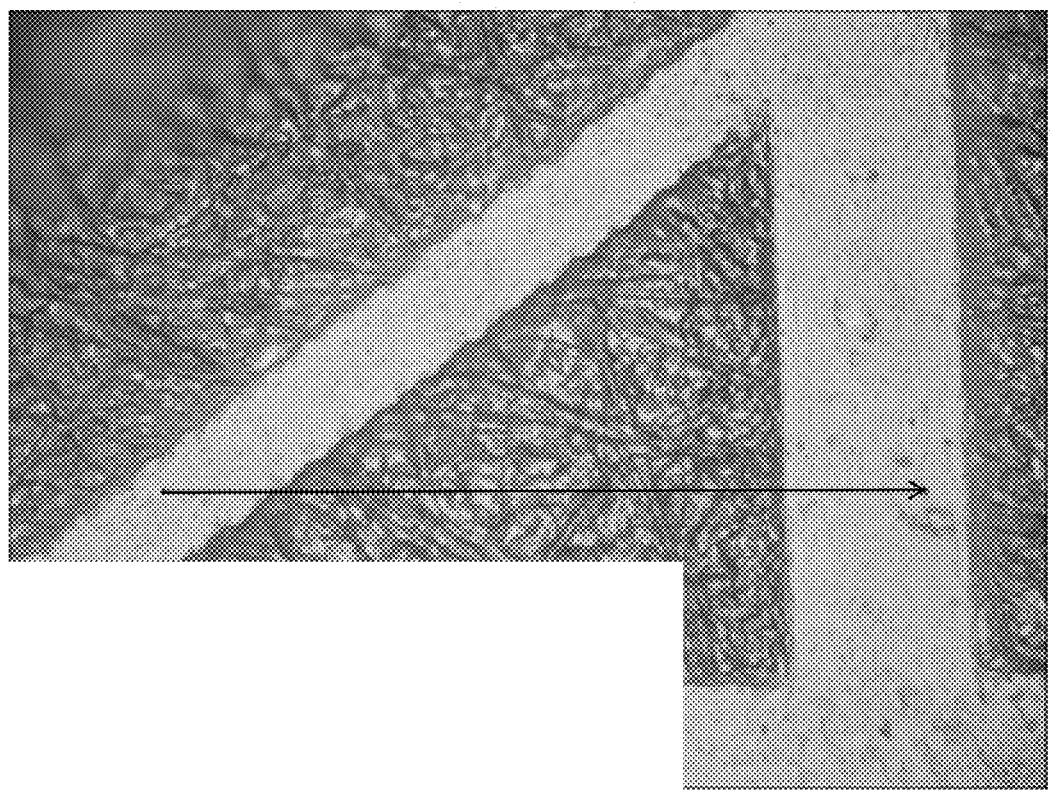
FIG. 5Aa is a reproduction of a close-up photograph taken of a text character created as a raised element on a third printing plate (67DFH) that was prepared by imagewise exposing in an environment containing an inert gas of nitrogen and 0.1% concentration of oxygen and thermally developing as described in Example 1. The photograph includes an arrow as a measurement vector that indicates location along which the text character was measured.
Figure 5A:
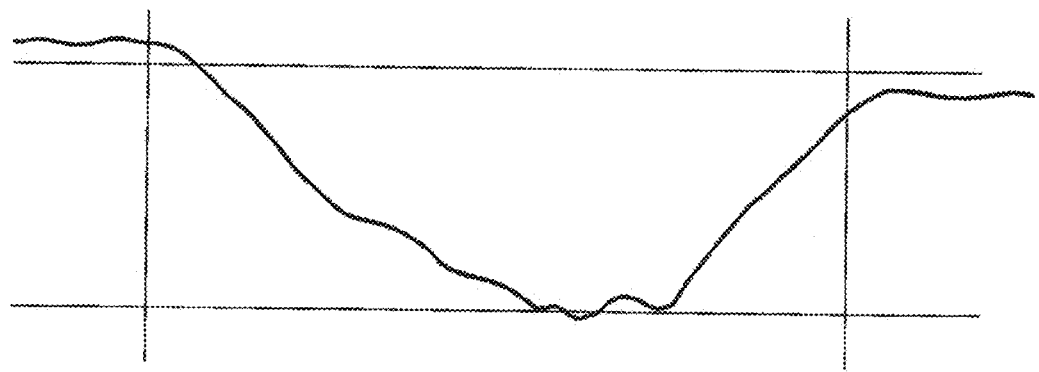
Figure 5B:
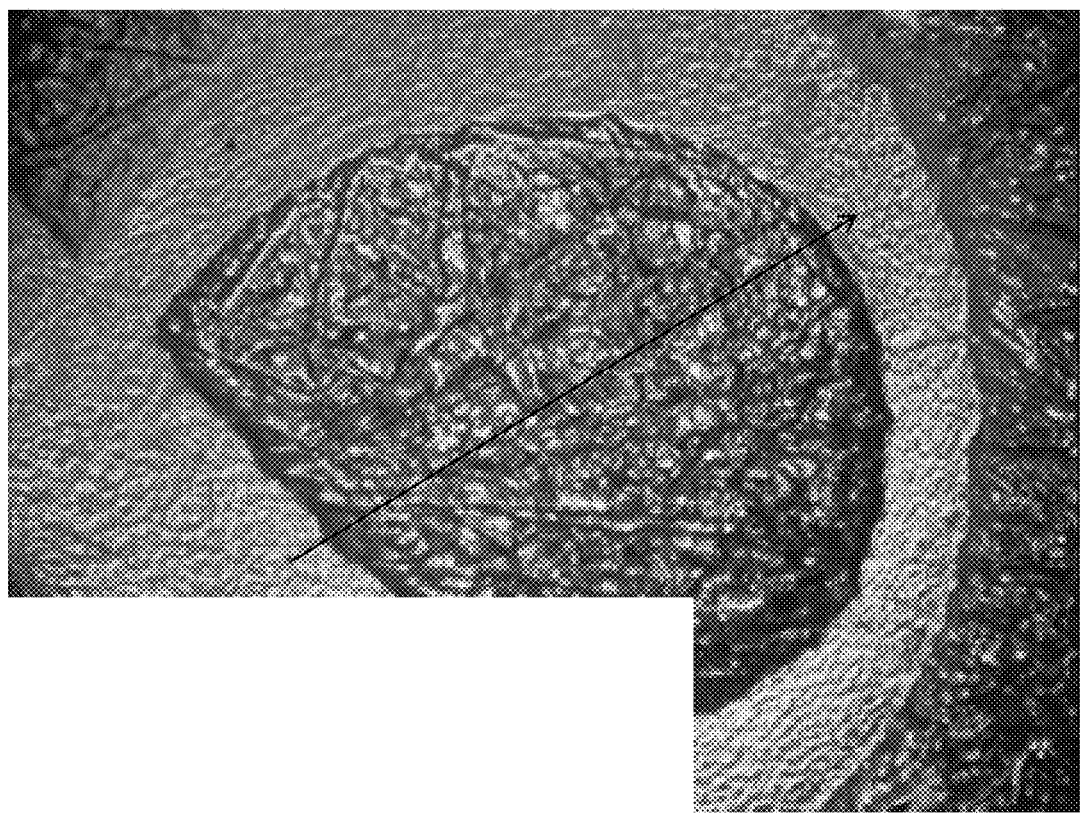
FIG. 5Ba is a reproduction of a close-up photograph taken of a second text character created as a raised element on a third printing plate (67DFH) that was prepared by imagewise exposing in an environment containing an inert gas of nitrogen and 0.1% concentration of oxygen and thermally developing as described in Example 1. The photograph includes an arrow as a measurement vector that indicates location along which the text character was measured.
Figure 5B:
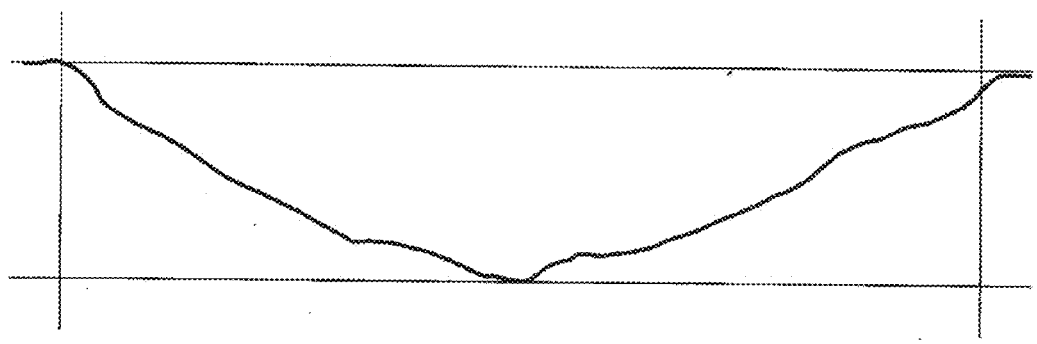
Figure 5C:
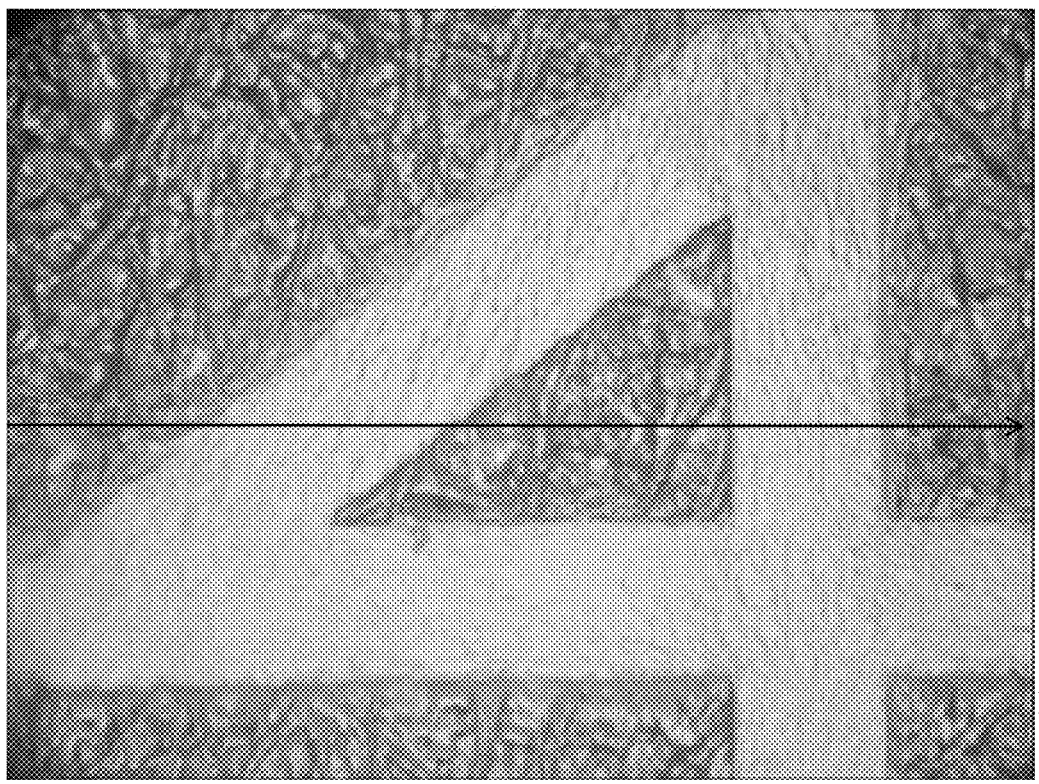
FIG. 5Ca is a reproduction of a chase-up photograph taken of a text character created as a raised element on a fourth printing plate (67DFH) that was prepared by imagewise exposing in an environment of an inert gas and having less than 0.01% oxygen such that the environment was considered to contain substantially only nitrogen, and thermally developing as described for Control A of Example 1. The photograph includes an arrow as a measurement vector that indicates location along which the text character was measured.
Figure 5C:
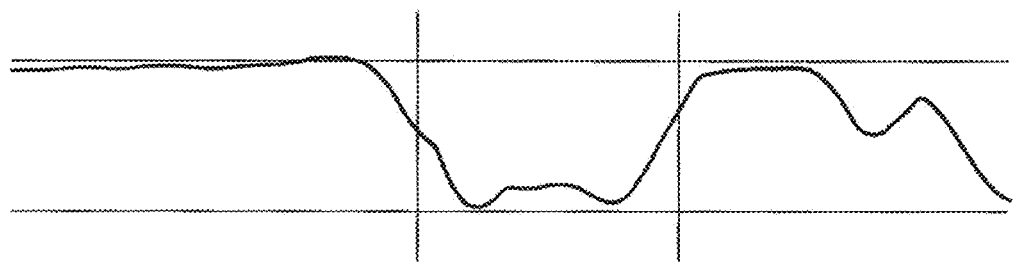
Figure 5D:
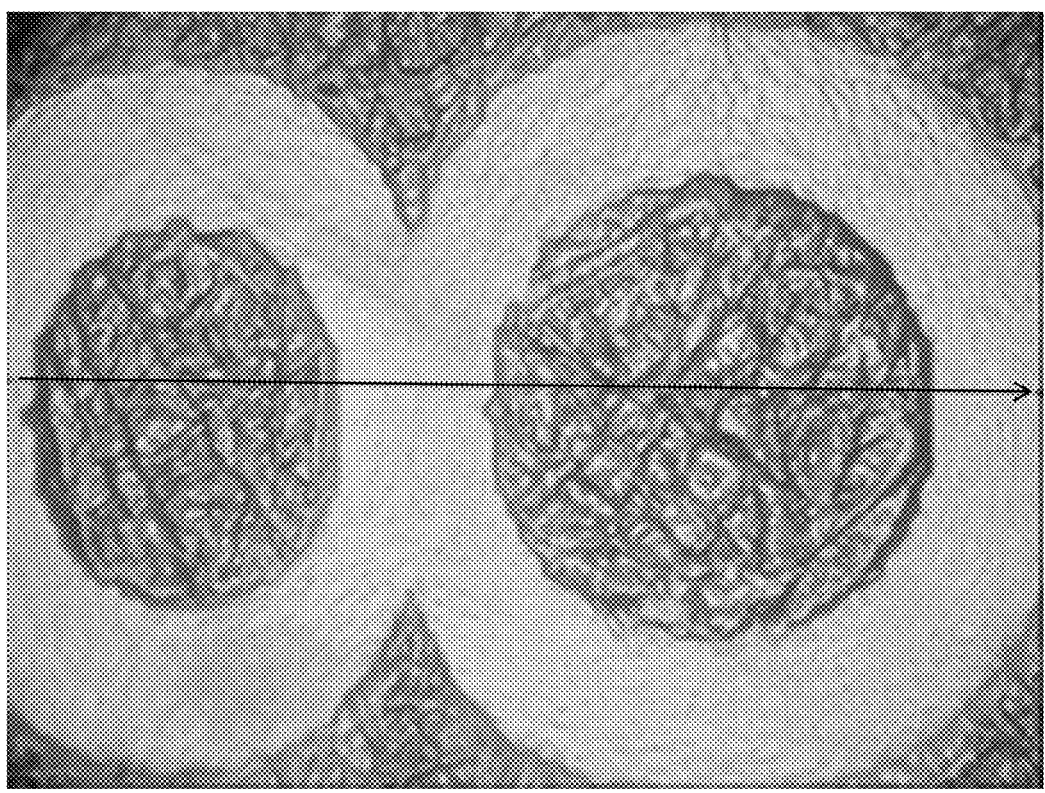
FIG. 5Da is a reproduction of a close-up photograph taken of a second text character created as a raised element on a fourth printing plate (67DFH) that was prepared by imagewise exposing in an environment of an inert gas and having less than 0.01% oxygen such that the environment was considered to contain substantially only nitrogen, and thermally developing as described for Control A of Example 1. The photograph includes an arrow as a measurement vector that indicates location along which the second text character was measured.
Figure 5D:
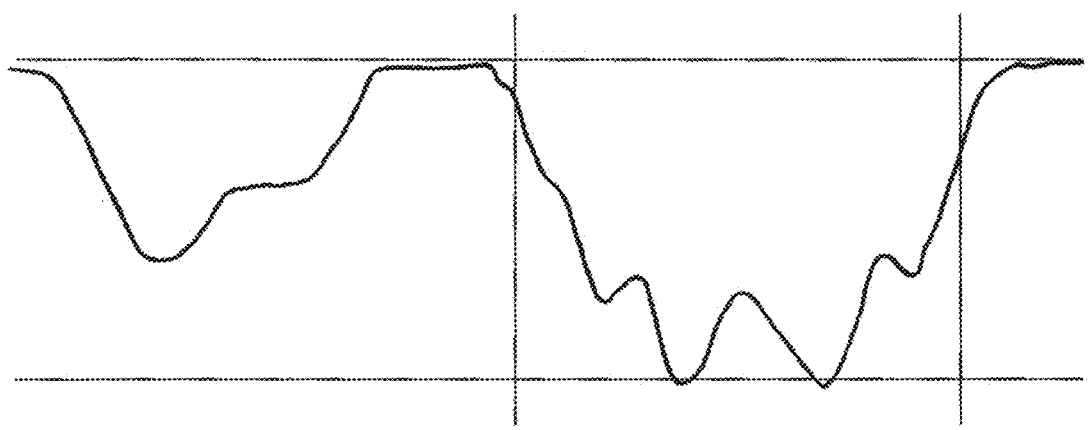
Figure 10A:
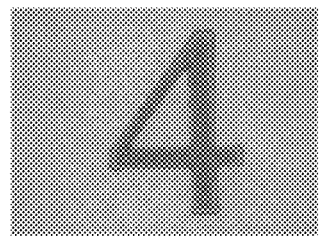
FIG. 10Aa, FIG. 10Ab, FIG. 10Ba, and FIG. 10Bb are reproductions of photographs taken of print samples containing text on a substrate that was printed by portions of two printing plates (both 67DFH). One plate was prepared by imagewise exposing in a specific environment containing an inert gas of nitrogen and concentration of oxygen as indicated and thermally developing as described in Example 1. The other printing plate was prepared by imagewise exposing a photosensitive element in an environment containing substantially only nitrogen, and thermally treating as described in Control A in Example 1.
Figure 10A:
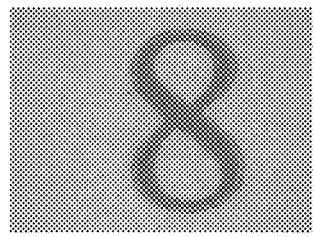
Figure 10B:
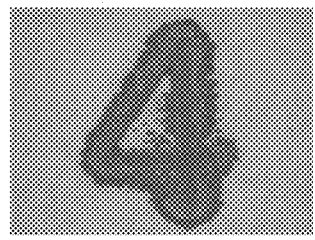
FIG. 10Ba is a reproduction of a photograph taken of the print sample containing a text character "4" on a substrate that was printed from another printing plate (67DFH) described as Control A in Example 1, wherein the plate was prepared by imagewise exposing in the environment of an inert gas and having less than 0.01% oxygen such that the environment was considered to contain substantially only nitrogen, and thermally treating.
Figure 10B:
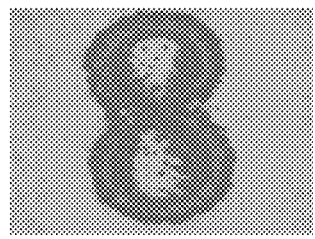

FIG. 1Aa through FIG. 1Ad; FIG. 1Ba through FIG. 1Bd; FIG. 1Ca through FIG. 1Cc; FIG. 2Aa through FIG. 2Ac; FIG. 2Ba through FIG. 2Bd; FIG. 2Be through FIG. 2Bh; FIG. 3Aa through FIG. 3Ad; FIG. 3Ba through FIG. 3Bd; FIG. 3Ca through FIG. 3Cd; FIG. 4Aa; FIG. 4Ba; FIG. 4Ca; FIG. 4Da; FIG. 5Aa; FIG. 5Ba; FIG. 5Ca; and FIG. 5Da are reproductions of photograph images taken of portions of the CYREL® 67DFH printing plate and of images printed by the plates, which were prepared as described in Example 1 and Control A, and in the Brief Description of the Drawings. FIG. 4Aa and its corresponding chart of FIG. 4Ab; FIG. 4Ba and its corresponding chart of FIG. 4Bb; FIG. 4Ca and its corresponding chart of FIG. 4Cb; FIG. 4Da and its corresponding chart of FIG. 4Db; FIG. 5Aa and its corresponding chart of FIG. 5Ab; FIG. 5Ba and its corresponding chart of FIG. 5Bb; HG. 5Ca and its corresponding chart of FIG. 5Cb; FIG. 5Da and its corresponding chart of FIG. 5Db originated from 67DFH printing plates prepared as described in Example 1 and in the Brief Description of the Drawings. From FIG. 1Aa through FIG. 1Ad; FIG. 1Ba through FIG. 1Bd; FIG. 1Ca through FIG. 1Cc; and FIG. 2Aa through FIG. 2Ac it was observed that dot formation was inhibited as oxygen concentration during imagewise exposure was increased, and was observed in the quality of the corresponding printed samples. It was further observed that the inhibition of halftone dots was less pronounced for higher line screens such as 171 lpi, and more pronounced for lower line screens such as 120 lpi. It was observed, by comparing the printing results of FIG. 2Aa through FIG. 2Ac to FIG. 2Ba through FIG. 2Bd that the definition and appearance of text elements improved as oxygen concentration increased. More halftone dots were formed in Control A as shown in FIG. 2Be through FIG. 2Bh, which was exposed in a substantially nitrogen-only environment; however in this case the floor and supporting regions between and around the halftone dots and the text elements exhibit less depth and therefore resulted in a smudged or dirtier printed result as shown in FIG. 2Ba through FIG. 2Bd. From FIG. 4Aa and FIG. 4Ab; FIG. 4Ba and FIG. 4Bb; FIG. 4Ca and FIG. 4Cb; FIG. 4Da and FIG. 4Db; FIG. 5Aa and FIG. 5Ab; FIG. 5Ba and FIG. 5Bb; FIG. 5Ca and FIG. 5Cb; FIG. 5Da and FIG. 5Db it was observed that cleanout of unpolymerized material from around and in text features improves as oxygen concentration during imagewise exposure was increased. FIG. 5Ca and FIG. 5Cb; FIG. 5Da and FIG. 5Db for the Control A exposure condition, shows that a large amount of material remains between and around the text elements as oxygen concentration decreases to nearly zero. FIG. 10Aa and FIG. 10Ab show the improvement in the printing result for text elements that have been image-wise exposed in a 1% oxygen environment versus text elements exposed using the Control A condition as shown in FIG. 10Ba and FIG. 10Bb.

Figure 6A:
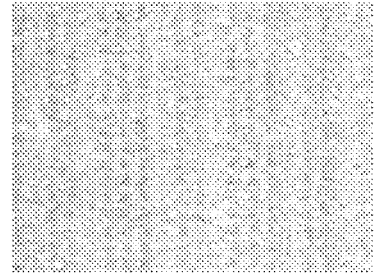
FIG. 6Aa through FIG. 6Ac, FIG. 6Ba through FIG. 6Bc, and FIG. 6Ca through FIG. 6Cc are reproductions of photographs taken of portions of printing plates (67DFQ), in which each portion of the plate is a field of 1 pixel dots that correspond with a screen area having specific line screen resolution provided by an in-situ mask for a photosensitive element, wherein each of three printing plates were prepared from each of three photosensitive elements by imagewise exposing each element in a specific environment containing an inert gas (i.e., nitrogen) and concentration of oxygen as indicated, and thermally developing as described in Example 2.
Figure 6A:
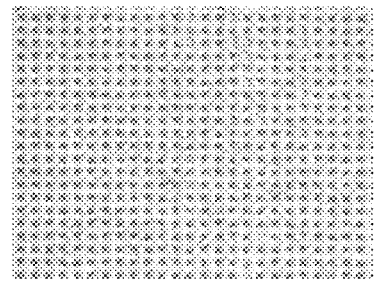
Figure 6A:
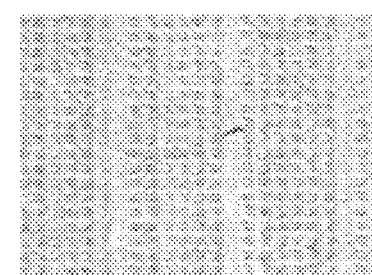
Figure 6B:
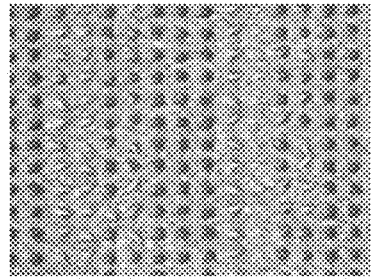
FIG. 6Ba is a reproduction of a photograph taken of a portion of a second printing plate at a line screen resolution of 133 lines per inch (lpi) as described above, wherein the plate was prepared by exposing in the environment containing nitrogen and 0.5% concentration of oxygen, and thermally treating.
Figure 6B:
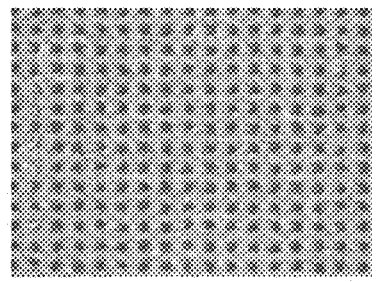
Figure 6B:
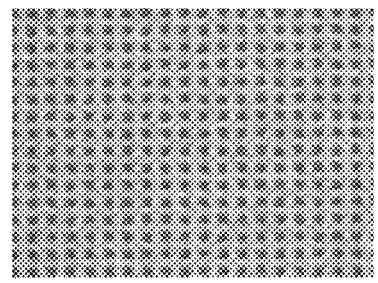
Figure 6C:
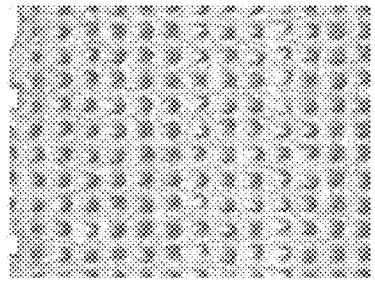
FIG. 6Ca is a reproduction of a photograph taken of a portion of a third printing plate at a line screen resolution of 120 lines per inch (lpi) as described above, wherein the plate was prepared in the environment containing nitrogen and 0.1% concentration of oxygen, and thermally treating.
Figure 6C:
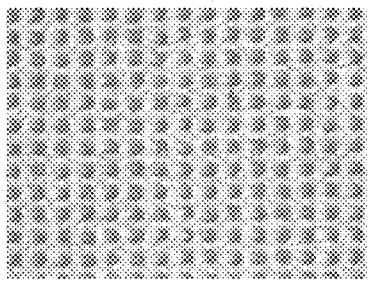
Figure 6C:
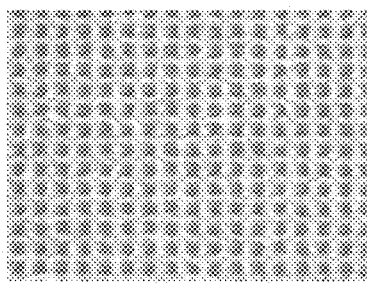
Figure 7A:
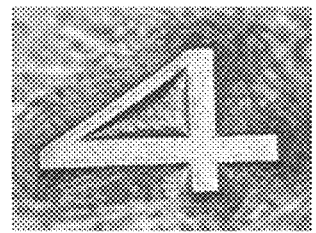
FIG. 7Aa through FIG. 7Ad, FIG. 7Ba through FIG. 7Bd, and FIG. 7Ca through FIG. 7Cd are reproductions of photographs taken of various text characters created in relief on a printing plate (67DFQ), wherein each of three printing plates were prepared from each of three photosensitive elements by imagewise exposing each element in a specific environment containing an inert gas and concentration of oxygen as indicated, and thermally developing as described in Example 2.
Figure 7A:
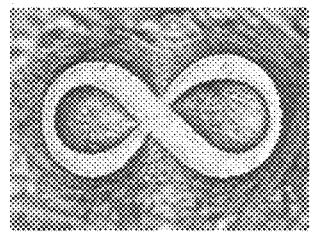
Figure 7A:
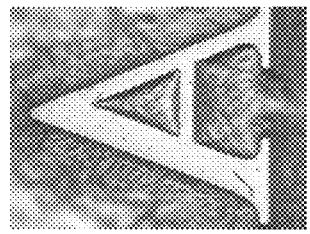
Figure 7A:
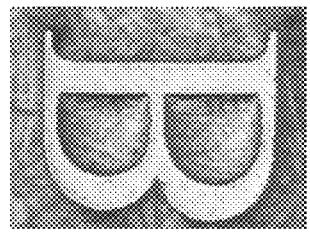
Figure 7B:
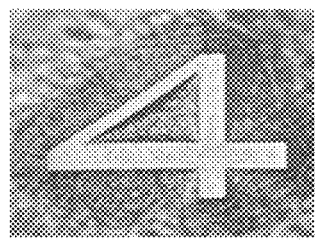
FIG. 7Ba is a reproduction of a photograph taken of a text character "4" from a second printing plate as described above, wherein the second plate was prepared by exposing in the environment containing nitrogen and 0.5% concentration of oxygen, and thermally treating.
Figure 7B:
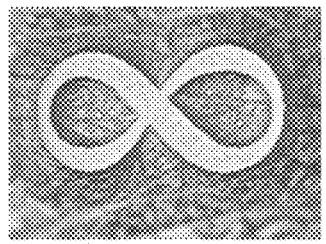
Figure 7B:
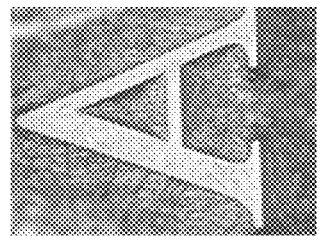
Figure 7B:
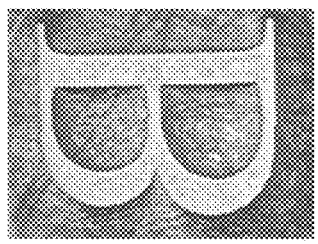
Figure 7C:
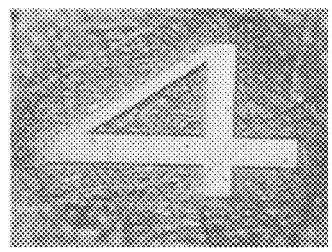
FIG. 7Ca is a reproduction of a photograph taken of a text character "4" from a third printing plate as described above, wherein the third plate was prepared by exposing in the environment containing nitrogen and 0.1% concentration of oxygen, and thermally treating.
Figure 7C:
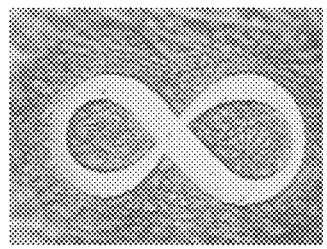
Figure 7C:
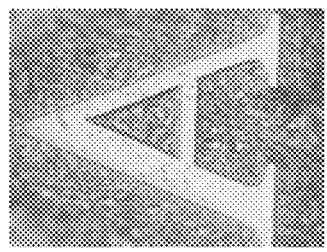
Figure 7C:
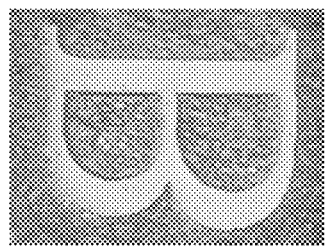
Figure 8A:
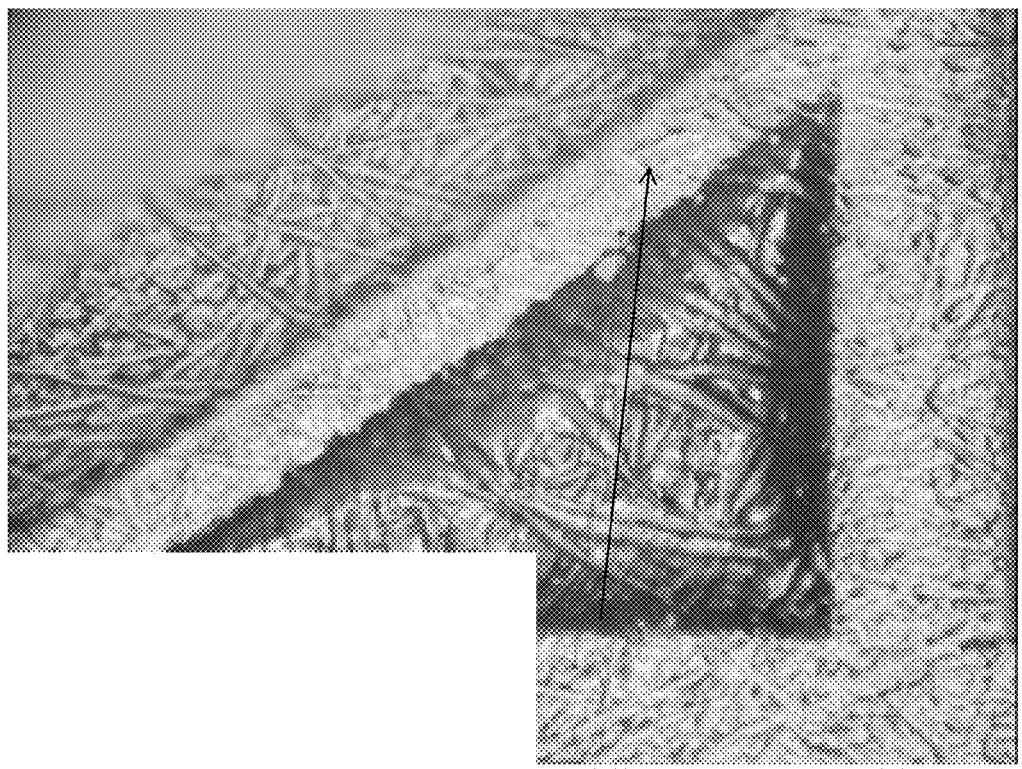
FIG. 8Aa is a reproduction of a close-up photograph taken of a text character created as a raised element on a first printing plate (67DFQ) that was prepared by imagewise exposing in an environment containing an inert gas of nitrogen and 1% concentration of oxygen and thermally developing as described in Example 2. The photograph includes an arrow as a measurement vector that indicates location along which the text character was measured.
Figure 8A:
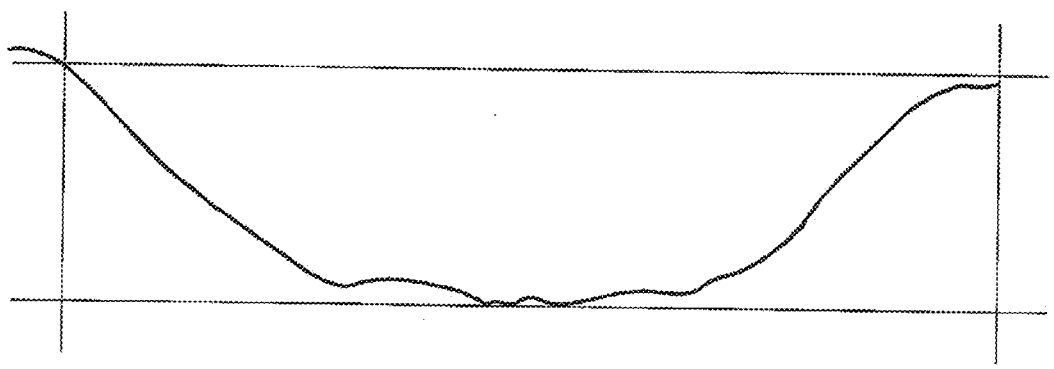
Figure 8B:
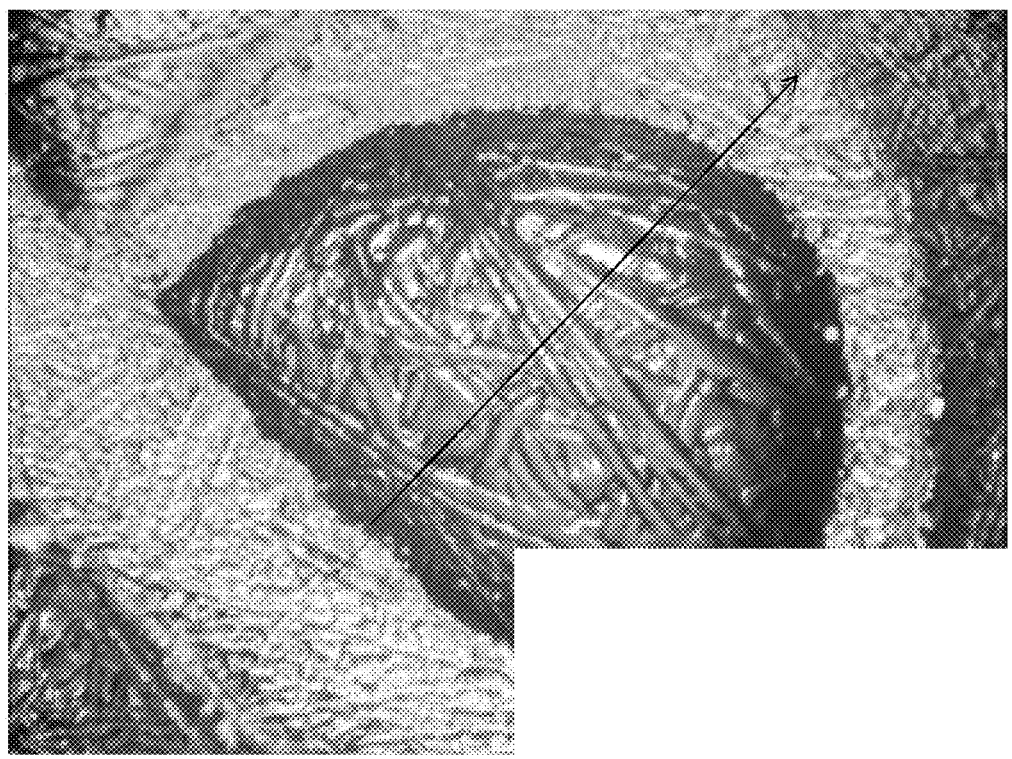
FIG. 8Ba is a reproduction of a close-up photograph taken of a second text character created as a raised element on the first printing plate (67DFQ) that was prepared by imagewise exposing in an environment containing an inert gas of nitrogen and 1% concentration of oxygen and thermally developing as described in Example 2. The photograph includes an arrow as a measurement vector that indicates location along which the second text character was measured.
Figure 8B:
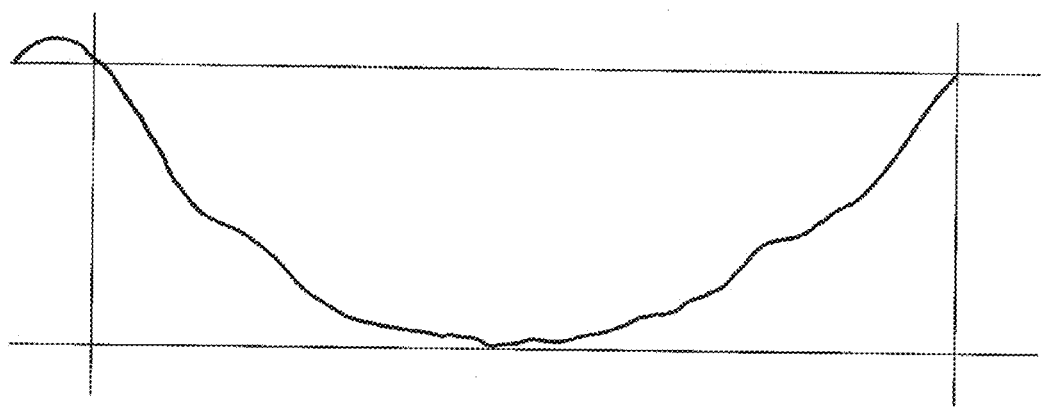
Figure 8C:
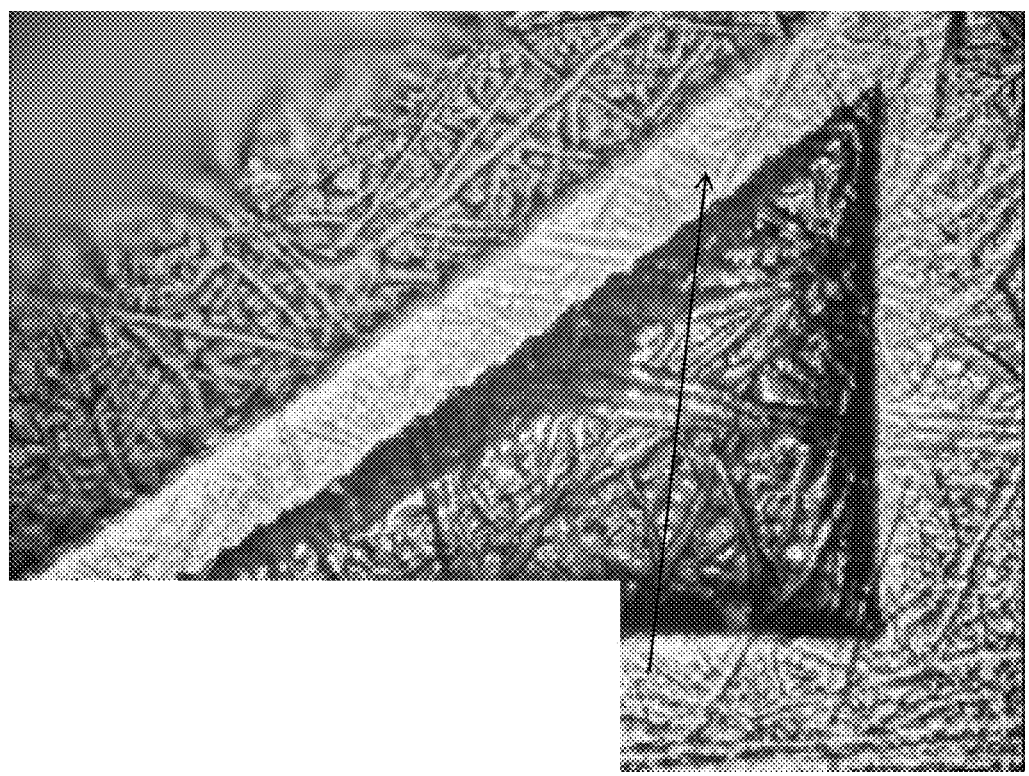
FIG. 8Ca is a reproduction of a close-up photograph taken of a text character created as a raised element on a second printing plate (67DFQ) that was prepared by imagewise exposing in an environment containing an inert gas of nitrogen and 0.5% concentration of oxygen and thermally developing as described in Example 2. The photograph includes an arrow as a measurement vector that indicates location along which the text character was measured.
Figure 8C:
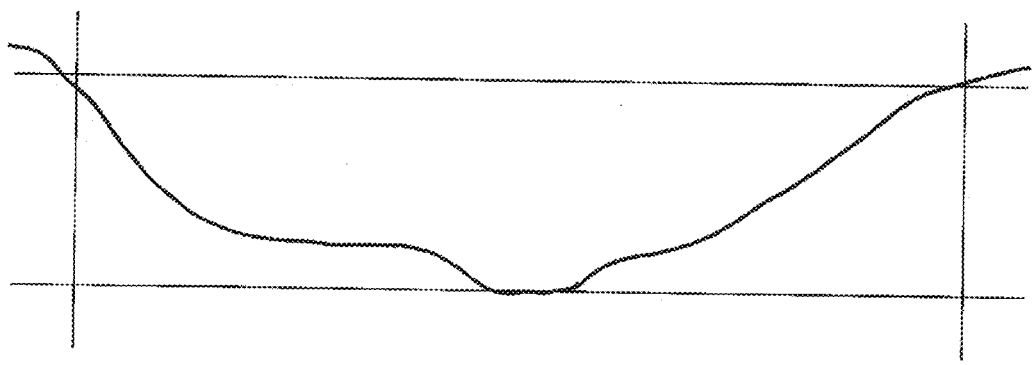
Figure 8D:
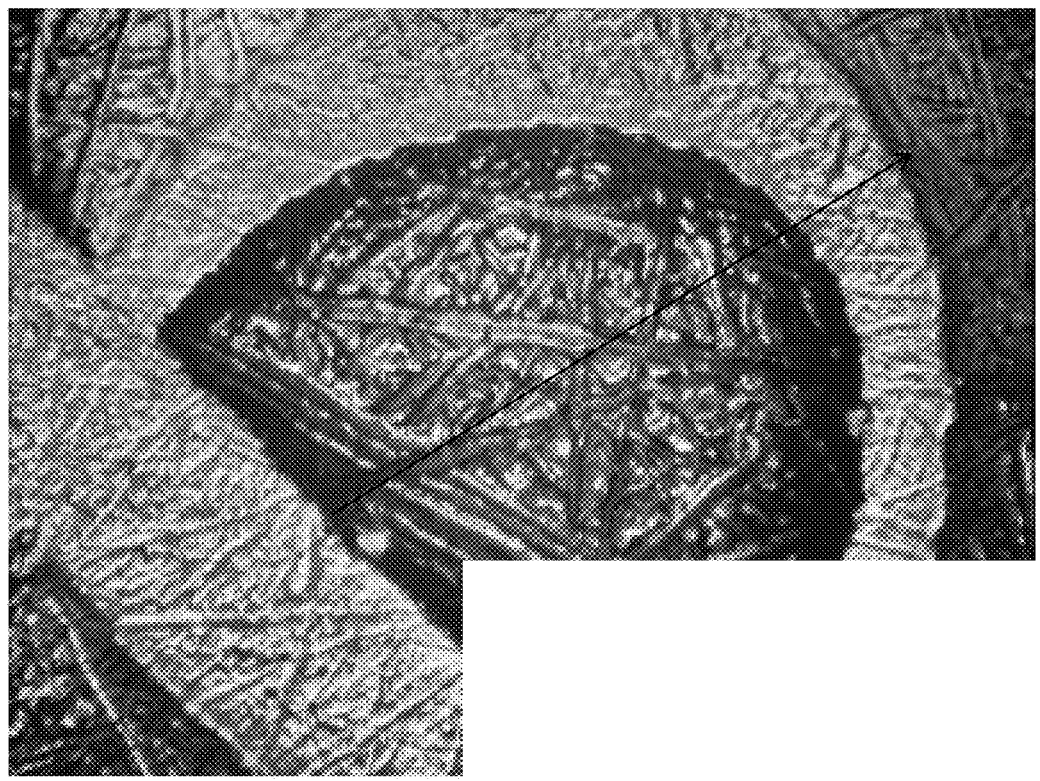
FIG. 8Da is a reproduction of a close-up photograph taken of a second text character created as a raised element on the second printing plate (67DFQ) that was prepared by imagewise exposing in an environment containing an inert gas of nitrogen and 0.5% concentration of oxygen and thermally developing as described in Example 2. The photograph includes an arrow as a measurement vector that indicates location along which the second text character was measured.
Figure 8D:
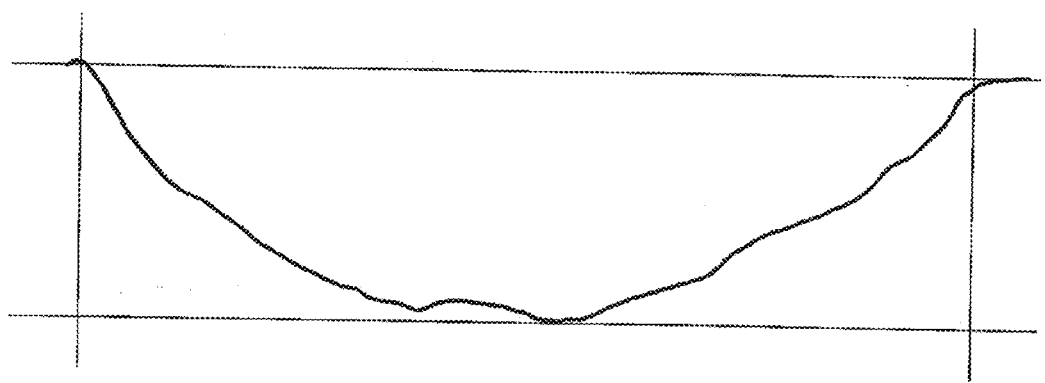
Figure 9A:
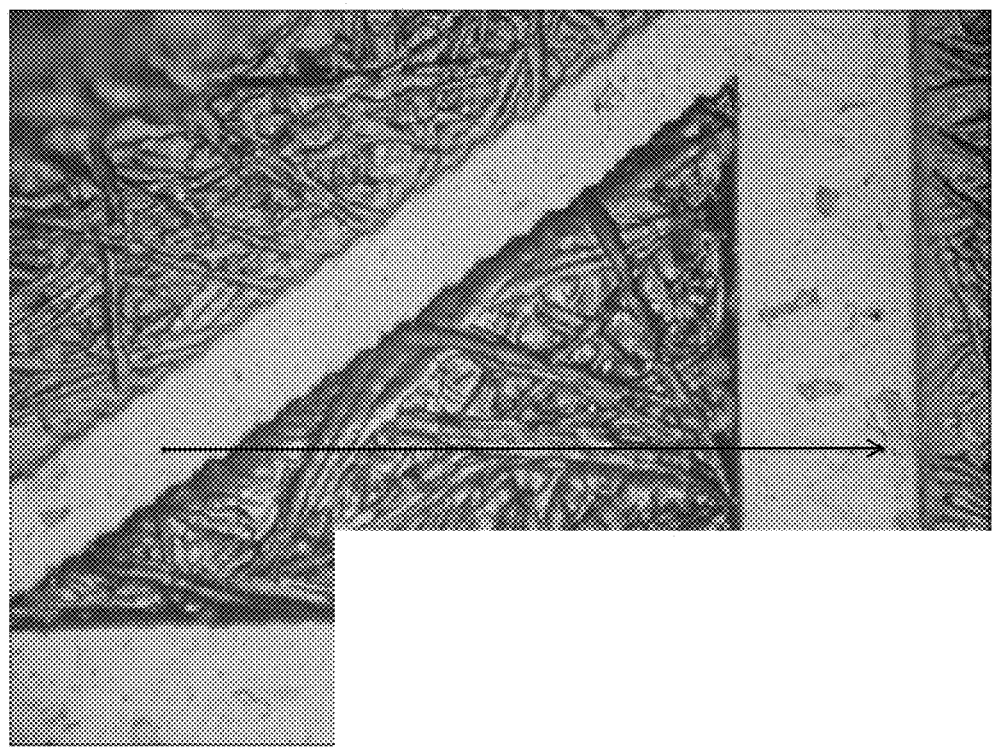
FIG. 9Aa is a reproduction of a close-up photograph taken of a text character created as a raised element on a third printing plate (67DFQ) that was prepared by imagewise exposing in an environment containing an inert gas of nitrogen and 0.1% concentration of oxygen and thermally developing as described in Example 2. The photograph includes an arrow as a measurement vector that indicates location along which the text character was measured.
Figure 9A:
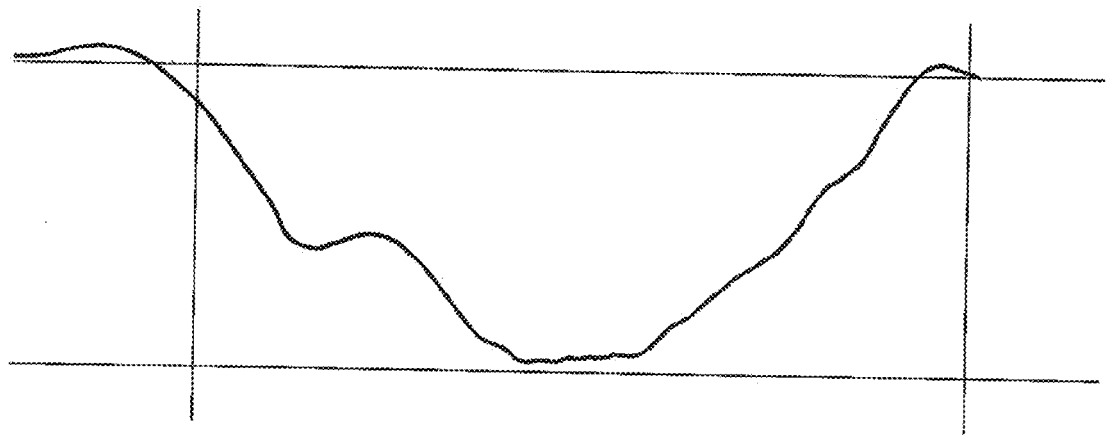
Figure 9B:
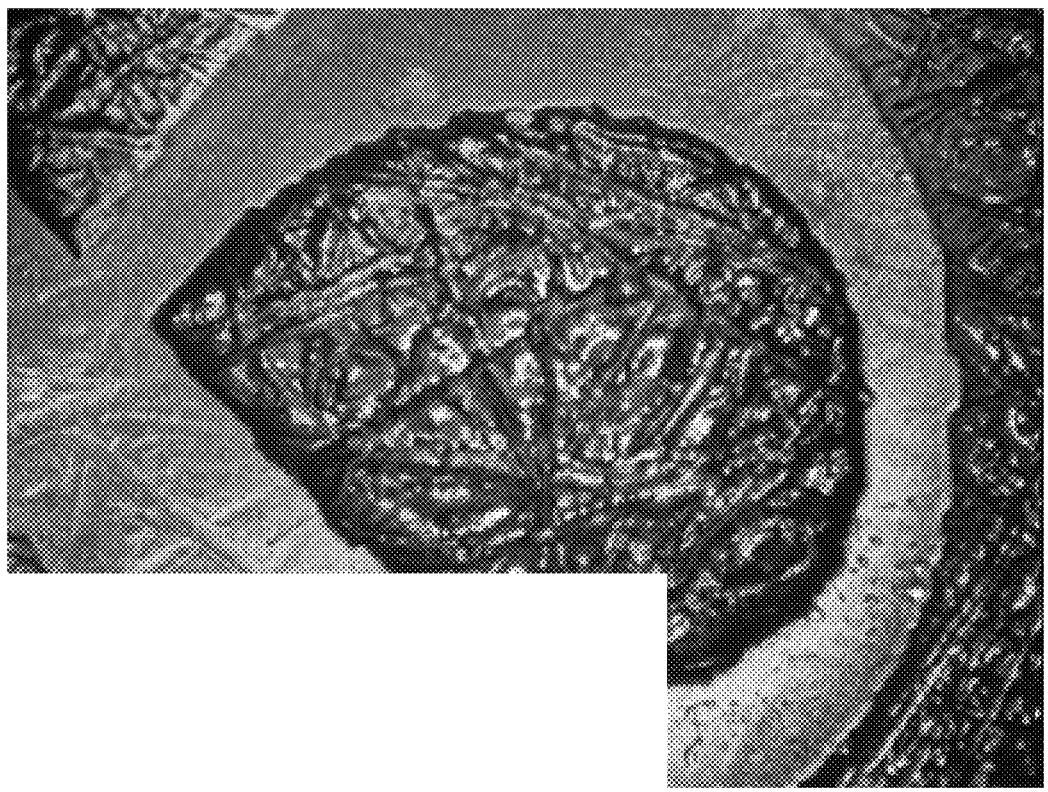
FIG. 9Ba is a reproduction of a close-up photograph taken of a second text character created as a raised element on a third printing plate (67DFQ) that was prepared by imagewise exposing in an environment containing an inert gas of nitrogen and 0.1% concentration of oxygen and thermally developing as described in Example 2. The photograph includes an arrow a measurement vector that indicates location along which the second text character was measured.
Figure 9B:
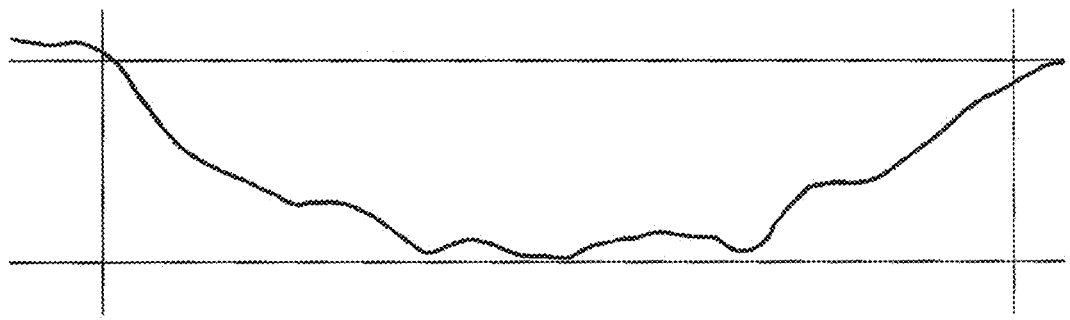

FIG. 6Aa through FIG. 6Ac; FIG. 6Ba through FIG. 6Bc; FIG. 6Ca through FIG. 6Cc; FIG. 7Aa through FIG. 7Ad; FIG. 7Ba through FIG. 7Bd; FIG. 7Ca through FIG. 7Cd; FIG. 8Aa; FIG. 8Ba; FIG. 8Ca; FIG. 8Da; FIG. 9Aa; and, FIG. 9Ba are reproductions of photograph images taken of portions of the CYREL® 67DFQ printing plate, which were prepared as described in Example 2, and in the Brief Description of the Drawings. FIG. 8Aa and its corresponding chart of FIG. 8Ab; FIG. 8Ba and its corresponding chart of FIG. 8Bb; FIG. 8Ca and its corresponding chart of FIG. 8Cb; FIG. 8Da and its corresponding chart of FIG. 8Db; FIG. 9Aa and its corresponding chart of FIG. 9Ab; FIG. 9Ba and its corresponding chart of FIG. 9Bb originated from 67DFQ printing plates prepared as described in Example 2 and in the Brief Description of the Drawings.

From FIG. 6Aa through FIG. 6Ac; FIG. 6Ba through FIG. 6Bc; FIG. 6Ca through FIG. 6Cc, it was observed that small feature formation was inhibited as oxygen concentration during imagewise exposure was increased, and was observed in the quality of the corresponding printed samples. From FIG. 7Aa through FIG. 7Ad; FIG. 7Ba through FIG. 7Bd; FIG. 7Ca through FIG. 7Cd; FIG. 8Aa and FIG. 8Ab; FIG. 8Ba and FIG. 8Bb; FIG. 8Ca and FIG. 8Cb; FIG. 8Da and FIG. 8Db; FIG. 9Aa and FIG. 9Ab; FIG. 9Ba and FIG. 9Bb it was observed that cleanout of unpolymerized material from around and in text features improves as oxygen concentration during imagewise exposure was increased.

The results demonstrated with two different plate types are consistent.

Examples 1 and 2 demonstrated the criticality of the availability a range of oxygen concentrations. It is very desirable to obtain improved halftone dot formation using the low end of the oxygen concentration; however, a trade-off exists in this end of the concentration range with the removal of the unpolymerized material by thermal development. For certain printing applications, for example those with substantially more halftone dot images and relatively few text features; it may be desirable to make use of the low end of the present oxygen concentration range. Conversely, for printing applications with substantially more text and line features and relatively few halftone dot images, it may be desirable to make use of a higher oxygen concentration range.

Examples 3 and 4

For Example 3 several relief printing plates were prepared as follows each from a photosensitive element of a CYREL® photopolymer printing element, type 67DFH (67 mils) as described above in Example 1.

For Example 4, several relief printing plates were prepared as follows each from a photosensitive element of a CYREL® photopolymer printing element, type 67DFQ as described above in Example 2.

All photosensitive elements of Examples 3 and 4 were exposed on a CYREL® Digital Imager Spark (from Esko Graphics Imaging GmbH), at 3750 milliJoules/cm$^2$, having infrared laser radiation to imagewise ablate the infrared radiation sensitive layer from the print element, and form an in-situ mask on the photosensitive element. The in-situ mask image created for the imagewise exposure was the same for all elements of Examples 3 and 4, and included line work (that is, text, symbols, and graphical elements) halftone dot areas (that is, approximately 1 inch square portions of images) having 1 pixel openings at various line screens. In addition, the in-situ mask included a plurality of open areas, which create solid printing surface areas for printing by the resulting printing plate. Some of the plurality of open areas included a screen pattern that formed microcells on the printing surface area of the resulting plate that printed areas of solid ink density. Several microcell patterns were used, each for a different open area. The microcell patterns used came with the software package for the CYREL® Digital Imager Spark. Some of the plurality of open areas did not include a microcell pattern. For each exposure condition, e.g., environment of inert gas of nitrogen with the desired oxygen concentration, one plate contained all the image features described above.

All the photosensitive elements having the in-situ mask of Examples 3 and 4 were exposed on a CYREL® exposure unit to ultraviolet radiation at 365 nm for a blanket exposure through the support for approximately 60 seconds to form a floor, and then were main exposed at 365 nm at the desired environment conditions indicated below through the in-situ mask. All the photosensitive elements were oriented so that the in-situ mask was face-up on the exposure bed, and facing open space of an exposure chamber. The CYREL® Exposure unit was modified to include an exposure chamber as described in US Patent Publication US 2009/0191483 for overall exposure of the photosensitive element through the in-situ mask (i.e., imagewise exposure of the photopolymerizable layer) to ultraviolet radiation in an environment at the conditions described below. The exposure chamber resided on a bed of the exposure unit such that the glass of the bed formed one side of the exposure chamber, and was sufficiently sized to accommodate the planar-shaped photosensitive printing element. The source of ultraviolet radiation was located external to the chamber. The exposure chamber included a top side (i.e., a roof) and wall sides attached to the perimeter of the top side, all of which were transparent or substantially transparent to the actinic radiation, e.g., ultraviolet radiation, for the radiation to transmit through to the photosensitive element without appreciable scattering or absorbance. The walls were of a height sufficient to create an open space in the chamber above the photosensitive element so that a blanket of an environment of the inert gas and controlled oxygen concentration was created adjacent the in-situ mask of the photosensitive element. The exposure chamber included inlet port/s for introducing an inert gas, which was nitrogen, and optionally oxygen into the chamber. The exposure chamber included outlet port/s for purging air and other gases from the chamber so that the environment inside the chamber can be controlled at the desired conditions. The exposure chamber also included at least one oxygen meter for determining the concentration of the oxygen within the exposure chamber. More than one meter may have been used in order to monitor the concentration of oxygen over a broad range of possible oxygen concentrations in the exposure chamber, since an oxygen meter may be capable of measuring only a portion of the possible range of oxygen concentrations. The oxygen concentration meter/s were located at the outlet port and measurement of the oxygen concentration at the outlet was representative of the concentration of oxygen in the internal environment of the exposure chamber. Each photosensitive element with the in-situ mask of Examples 3 and 4 were placed face up on the exposure bed and the exposure chamber was closed. Then, prior to main exposure, a precise mixture of both nitrogen as the inert gas and oxygen was introduced into the chamber. Main exposure was started when the internal environment of the exposure chamber reached the desired condition, and continued for the time indicated while the desired condition was maintained by the continued introduction of both nitrogen as the inert gas and oxygen in to the chamber. For Examples 3 and 4 the main exposure was 10 minutes at about 18 milliJoules/cm$^2$.

For Examples 3 and 4, the photosensitive elements (with mask) were main exposed at three different environment conditions in the exposure chamber, in which the concentration of oxygen was at 1% (10000 ppm), 3% (30000 ppm), and 5% (50,000 ppm), and the inert gas was nitrogen.

The photosensitive elements were processed in a CYREL®FAST TD1000 thermal development apparatus at the standard conditions recommended for developing 67 mil thick plates, to form a relief surface suitable for flexographic printing. Infrared lamps were used to aid in heating the photosensitive element. A pass of the printing element in the thermal processor constituted heating the element, contacting the element with a web of a nonwoven development medium to remove unpolymerized portions, and separating the development medium from the element.

Relief areas, which included raised elements of text and screen elements, and solid areas were formed in the resulting printing plates. A Nikon SMZ800 stereomicroscope (from NIKON (USA) (Melville, N.Y.)) was used to observe the raised elements and the print surface areas for solid ink printing of the resulting plates. In particular, the formation of desired microcell pattern on the solid print surface areas of the printing plates was evaluated. For both plates of Examples 3 and 4, the microcell pattern became less defined as the concentration of oxygen increased in the environment during exposure. The fine features (i.e., 30 microns or less) of the recessed areas in the microcell pattern lost definition since the recessed areas or cells became shallow and wider, and the space between cells started to overlap.

The plates of Examples 3 and 4 were printed onto a polypropylene web substrate using a PCMC Avanti wide web press, at the standard printing conditions with a solvent ink as practiced by experienced, skilled press operators. The printed images were evaluated for print quality, and substantiated that the observations and ratings of the microscopic images were reproduced on the printed images. That is, the areas of solid ink density were measured on a GretagMacbeth SpectroScan 3.273 (from Gretag-MacBeth AG (Regensdorf Switzerland))

and are reported in the following Table 3. The reported solid ink density was an average of 6 readings.

TABLE 3

|  |  |  | Solid Ink Density | | | |
| --- | --- | --- | --- | --- | --- | --- |
|  | Element | Environment: Nitrogen and | No Microcell | Microcell Pattern-1 | Microcell Pattern-2 | Microcell Pattern-3 |
| Example 3 | DFH | 1% oxygen | 1.3 | 1.49 | 1.49 | 1.49 |
| Example 3 | DFH | 3% oxygen | 1.26 | 1.44 | 1.43 | 1.43 |
| Example 3 | DFH | 5% oxygen | 1.19 | 1.33 | 1.32 | 1.33 |
| Example 4 | DFQ | 1% oxygen | 1.37 | 1.43 | 1.43 | 1.44 |
| Example 4 | DFQ | 3% oxygen | 1.3 | 1.38 | 1.4 | 1.39 |
| Example 4 | DFQ | 5% oxygen | 1.23 | 1.36 | 1.38 | 1.36 |

Results showed that overall the density of the ink in the solid areas (i.e., solid ink density) printed on the substrate by the plate decreased with increasing oxygen content in the environment during imagewise exposure. Even so, the solid ink density at 5% oxygen concentration of the exposure environment was better depending on the microcell pattern than the solid areas having no microcell pattern. For some microcell patterns, the solid ink density at 5% oxygen concentration of the exposure environment was the same or substantially the same as the solid ink density for solid areas having no microcell pattern. As shown by the results of Example 3, for the plates having microcell pattern in the solid print surface areas, the solid ink density provided by a plate prepared by exposing in an environment having nitrogen and 5% oxygen concentration decreased when compared to the solid ink density provided by a plate prepared at 3% oxygen concentration, and was better than the solid ink density for plates having no microcell pattern. As shown by the results of Example 4, for the plates having microcell pattern in the solid print surface areas, the solid ink density provided by a plate prepared by exposing in an environment having nitrogen and 5% oxygen concentration was at least comparable to the solid ink density provided by a plate prepared at 3% oxygen concentration, and comparable or better than the solid ink density for plates having no microcell pattern. This indicates that in most cases fine features, particularly those of the microcell patterns, can be sufficiently formed and defined for printing plates prepared by exposing in an environment having an inert gas and about 5% oxygen concentration, such that an improvement in solid ink density can be observed. And that one would expect that the preparation of a relief printing plate in an exposure environment of an inert gas and greater than about 5% oxygen concentration would not hold microcell patterning sufficient to provide the desired increase in solid ink density.

The invention claimed is:

1. A method for preparing a relief printing form from a photosensitive element, comprising the steps of:
 (a) forming an in-situ mask disposed above a layer of a photopolymerizable composition in the photosensitive element, wherein the photopolymerizable composition comprises a binder, an ethylenically unsaturated compound and a photoinitiator;
 (b) imagewise exposing the photopolymerizable layer to actinic radiation through the in-situ mask in an environment having an inert gas and a concentration of oxygen between 50,000 ppm and 2000 ppm, forming at least a polymerized portion and at least an unpolymerized portion;
 (c) treating by heating the photosensitive element of step b) to a temperature sufficient to cause the unpolymerized portion to melt, flow, or soften, and,
 (d) removing the unpolymerized portion that melt, flow, or soften to form the relief printing form having a plurality of raised surface elements made of the polymerized portion, each raised surface element having a print surface area,
 wherein the in-situ mask includes actinic radiation opaque areas and open areas, and in one or more of the open areas that produce image areas comprising halftone dot image areas and in one or more of the open areas that produce image areas comprising solid image areas, comprises a microcell pattern comprising a plurality of features in which each feature has dimension between 5 and 30 microns that is opaque to actinic radiation, and
 wherein after the removing step, the print surface area of one or more of the raised surface elements that form halftone dot image areas have the microcell pattern induced therein, and the print surface area of one or more of the raised surface elements that form the solid image areas have the microcell pattern induced therein.

2. The method of claim 1 wherein the removing step further comprises contacting a development medium to the unpolymerized portions of the photosensitive element.

3. The method of claim 1 wherein the inert gas is selected from the group consisting of argon, helium, neon, krypton, xenon, nitrogen, carbon dioxide, and combinations thereof.

4. The method of claim 1 wherein a layer of an actinic radiation opaque material is disposed above the photopolymerizable layer, and step a) comprises imagewise exposing the actinic radiation opaque layer with laser radiation to form the in-situ mask.

5. The method of claim 4 wherein the imagewise exposing with laser radiation is selected from the group consisting of (a) selectively ablating the actinic radiation opaque layer from the photopolymerizable layer, and (b) selectively transferring portions of the actinic radiation opaque layer to the photopolymerizable layer.

6. The method of claim 1 further comprising, prior to step b), placing the photosensitive element in a chamber for the environment.

7. The method of claim 6 wherein the step of imagewise exposing the photopolymerizable layer begins when the concentration of oxygen in the chamber is between 50,000 ppm and 2000 ppm.

8. The method of claim 6 wherein the step of imagewise exposing the photopolymerizable layer begins when the concentration of oxygen in the chamber is less than or equal to 50,000 ppm and the concentration of oxygen is reduced during the exposing by introducing the inert gas into the chamber.

9. The method of claim 6 wherein the step of imagewise exposing the photopolymerizable layer begins when the concentration of oxygen in the enclosure is between 50,000 ppm and 2000 ppm and the concentration of oxygen is maintained for the exposing by introducing the inert gas and oxygen into the chamber.

10. The method of claim 1 wherein the environment comprises nitrogen as the inert gas and the concentration of oxygen is 50,000 ppm to 2000 ppm.

11. The method of claim 1 wherein the environment comprises nitrogen as the inert gas and the concentration of oxygen is 40,000 ppm to 2000 ppm.

12. The method of claim 1 wherein the environment comprises nitrogen as the inert gas and the concentration of oxygen is 30,000 ppm to 2000 ppm.

13. The method of claim 1 wherein the environment comprises nitrogen as the inert gas and the concentration of oxygen is 25,000 ppm to 2000 ppm.

14. The method of claim 6 wherein the step of imagewise exposing of the photopolymerizable layer occurs for a total exposure time, and during said exposure the concentration of oxygen is a weighted average of oxygen concentration based on the percentage of time at a particular oxygen concentration.

\* \* \* \* \*